United States Patent
Kim et al.

(10) Patent No.: US 11,297,219 B2
(45) Date of Patent: Apr. 5, 2022

(54) IMAGE SENSOR

(71) Applicant: SAMSUNG ELECTRONICS CO., LTD., Suwon-si (KR)

(72) Inventors: Bumsuk Kim, Hwaseong-si (KR); Kwanhee Lee, Suwon-si (KR); Yun Ki Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 26 days.

(21) Appl. No.: 16/847,146

(22) Filed: Apr. 13, 2020

(65) Prior Publication Data

US 2020/0396388 A1 Dec. 17, 2020

(30) Foreign Application Priority Data

Jun. 11, 2019 (KR) .......................... 10-2019-0068748
Aug. 9, 2019 (KR) .......................... 10-2019-0097394

(51) Int. Cl.
*H04N 5/232* (2006.01)
*H04N 5/225* (2006.01)
*H04N 5/378* (2011.01)
*H04N 9/04* (2006.01)

(52) U.S. Cl.
CPC ..... *H04N 5/232122* (2018.08); *H04N 5/2254* (2013.01); *H04N 5/378* (2013.01); *H04N 9/04557* (2018.08)

(58) Field of Classification Search
CPC ......... H04N 5/232122; H04N 9/04557; H04N 5/2254; H04N 5/36961; H04N 5/335; H04N 5/378; H04N 3/155; H04N 9/045; H01L 27/14621; H01L 27/14627; H01L 27/14625; H01L 27/1463; H01L 27/14603
See application file for complete search history.

(56) References Cited

U.S. PATENT DOCUMENTS

| | | |
|---|---|---|
| 7,978,240 B2 | 7/2011 | Kido et al. |
| 9,729,806 B2 | 8/2017 | Fettig et al. |
| 9,804,357 B2 | 10/2017 | Galor Gluskin et al. |
| 2012/0242874 A1* | 9/2012 | Noudo .............. H01L 27/14623 348/294 |
| 2017/0243912 A1 | 8/2017 | Kaneda |
| 2018/0352199 A1* | 12/2018 | Hwang ............. H01L 27/14605 |
| 2019/0052823 A1 | 2/2019 | Jung et al. |
| 2019/0132506 A1* | 5/2019 | Cheng ................. H04N 5/36961 |

FOREIGN PATENT DOCUMENTS

| | | |
|---|---|---|
| JP | 2019-12968 A | 1/2019 |
| WO | 2019/026718 A1 | 2/2019 |

* cited by examiner

*Primary Examiner* — Abdelaaziz Tissire
(74) *Attorney, Agent, or Firm* — Sughrue Mion, PLLC

(57) ABSTRACT

An image sensor is disclosed. The image sensor may include pixel groups, which are two-dimensionally arranged on a substrate, and each of the pixel groups including a plurality of pixels. The image sensor may also include a light-blocking pattern, which is disposed on the substrate and between the pixels. The pixel groups may include first image pixel groups sensing a first light, second image pixel groups sensing a second light, and an auto-focus (AF) pixel group detecting a phase. The AF pixel group may include a first AF pixel and a second AF pixel adjacent to each other, and the light-blocking pattern may be absent on the substrate between the first AF pixel and the second AF pixel.

18 Claims, 27 Drawing Sheets

IMAGE SENSOR

CROSS-REFERENCE TO RELATED APPLICATIONS

This application claims priority under 35 U.S.C. § 119 from Korean Patent Application No. 10-2019-0068748, filed on Jun. 11, 2019, and Korean Patent Application No. 10-2019-0097394, filed on Aug. 9, 2019, in the Korean Intellectual Property Office, the entire contents of which are hereby incorporated by reference.

BACKGROUND

Apparatuses and methods consistent with one or more exemplary embodiments relate to an image sensor.

An image sensor is an electronic device that converts image information to electrical signals, and is used in consumer electronic devices (e.g., digital cameras, cellphone cameras, and portable camcorders) and cameras mounted to cars, security systems, and robots. The image sensor includes a pixel array including a plurality of pixels, and each of the pixels includes a light sensing device. In order to obtain precise image information within a short time, the image sensor may have an auto-focusing function.

SUMMARY

Aspects of one or more exemplary embodiments provide an image sensor configured to have an auto-focusing function to obtain a clear image.

According to an aspect of an exemplary embodiment, there is provided an image sensor including: pixel groups, which are two-dimensionally arranged on a substrate, each of the pixel groups including a plurality of pixels, and a light-blocking pattern, which is on the substrate and between the pixels. The pixel groups may include first image pixel groups configured to sense a first light, second image pixel groups configured to sense a second light, and an auto-focus (AF) pixel group configured to detect a phase. The AF pixel group may include a first AF pixel and a second AF pixel adjacent to each other, and the light-blocking pattern may be absent on the substrate between the first AF pixel and the second AF pixel.

According to an aspect of another exemplary embodiment, there is provided an image sensor including pixel groups, which are two-dimensionally arranged on a substrate, each of the pixel groups including a plurality of pixels, and a micro lens array layer covering the substrate. The pixels may be separated from each other by a deep device isolation structure provided in the substrate, and each of the pixels may include a photoelectric conversion portion provided in the substrate. The pixel groups may include image pixel groups, an auto-focus (AF) pixel group configured to detect a phase, and a first peripheral pixel group located between the AF pixel group and a closest image pixel group, from among the image pixel groups, closest to the AF pixel group. A first distance from a top end of the micro lens array layer to the substrate, measured between the peripheral image pixel group and the AF pixel group, may be less than a second distance from a top end of the micro lens array layer to the substrate, measured between the peripheral image pixel group and the closest image pixel group.

According to an aspect of another exemplary embodiment, there is provided an image sensor including pixel groups, which are two-dimensionally arranged on a substrate, each of the pixel groups including a plurality of pixels. The pixel groups may include image pixel groups, an auto-focus (AF) pixel group configured to detect a phase, and a peripheral image pixel group located between the AF pixel group and a closest the image pixel group, from among the image pixel groups, closest to the AF pixel group. The peripheral image pixel group may include a plurality of peripheral image pixels, and the AF pixel group may include a plurality of AF pixels. A peripheral image pixel, from among the peripheral image pixels, may include a peripheral photoelectric conversion portion in the substrate, and an AF pixel, from among the AF pixels, may include an AF photoelectric conversion portion in the substrate. An area of the peripheral photoelectric conversion portion may be less than an area of the AF photoelectric conversion portion, when viewed in a plan view.

According to an aspect of another exemplary embodiment, there is provided an image sensor including: pixel groups, which are two-dimensionally arranged on a substrate, each of the pixel groups including a plurality of pixels. The pixel groups may include first image pixel groups configured to sense a first light, second image pixel groups configured to sense a second light, an auto-focus (AF) pixel group configured to detect a phase and including a first AF pixel and a second AF pixel, a first peripheral image pixel group, between the first AF pixel and a closest first image pixel group, among the first image pixel groups, closest to the first AF pixel, the first peripheral image pixel group including less pixels than the closest first image pixel group, and a second peripheral image pixel group, between the second AF pixel and a closest second image pixel group, among the second image pixel groups, closest to the second AF pixel, the second peripheral image pixel group including less pixels than the closest second image pixel group. The first peripheral image pixel group may be configured to sense the second light, and the second peripheral image pixel group may be configured to sense the first light.

BRIEF DESCRIPTION OF THE DRAWINGS

Exemplary embodiments will be more clearly understood from the following detailed description taken in conjunction with the accompanying drawings, in which.

DETAILED DESCRIPTION

One or more exemplary embodiments will now be described with reference to the accompanying figures. It should be noted that these figures are intended to illustrate the general characteristics of methods, structures and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Figure 1A:
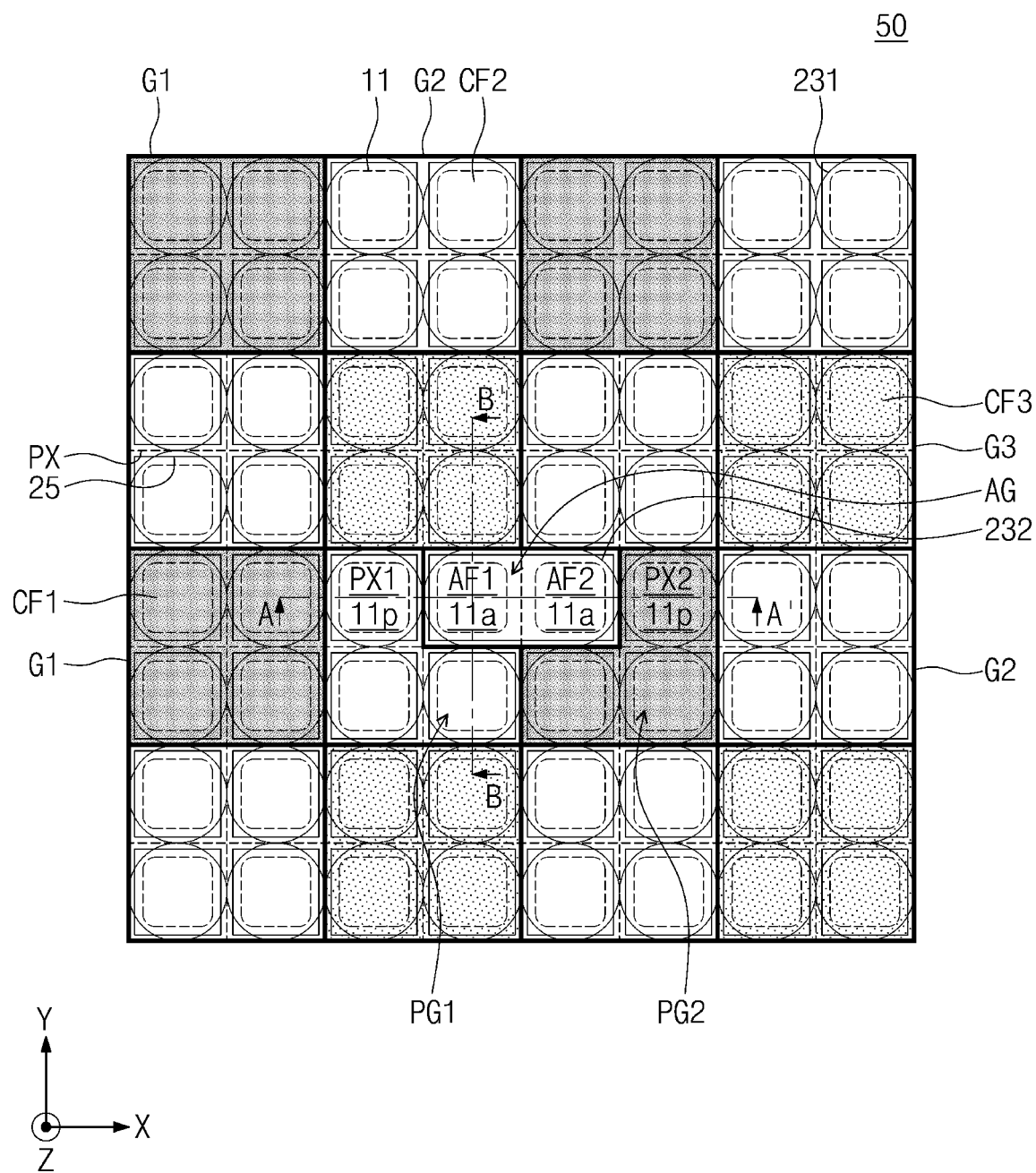
FIGS. 1A and 1B are plan views illustrating an image sensors according to an exemplary embodiment.
Figure 1B:
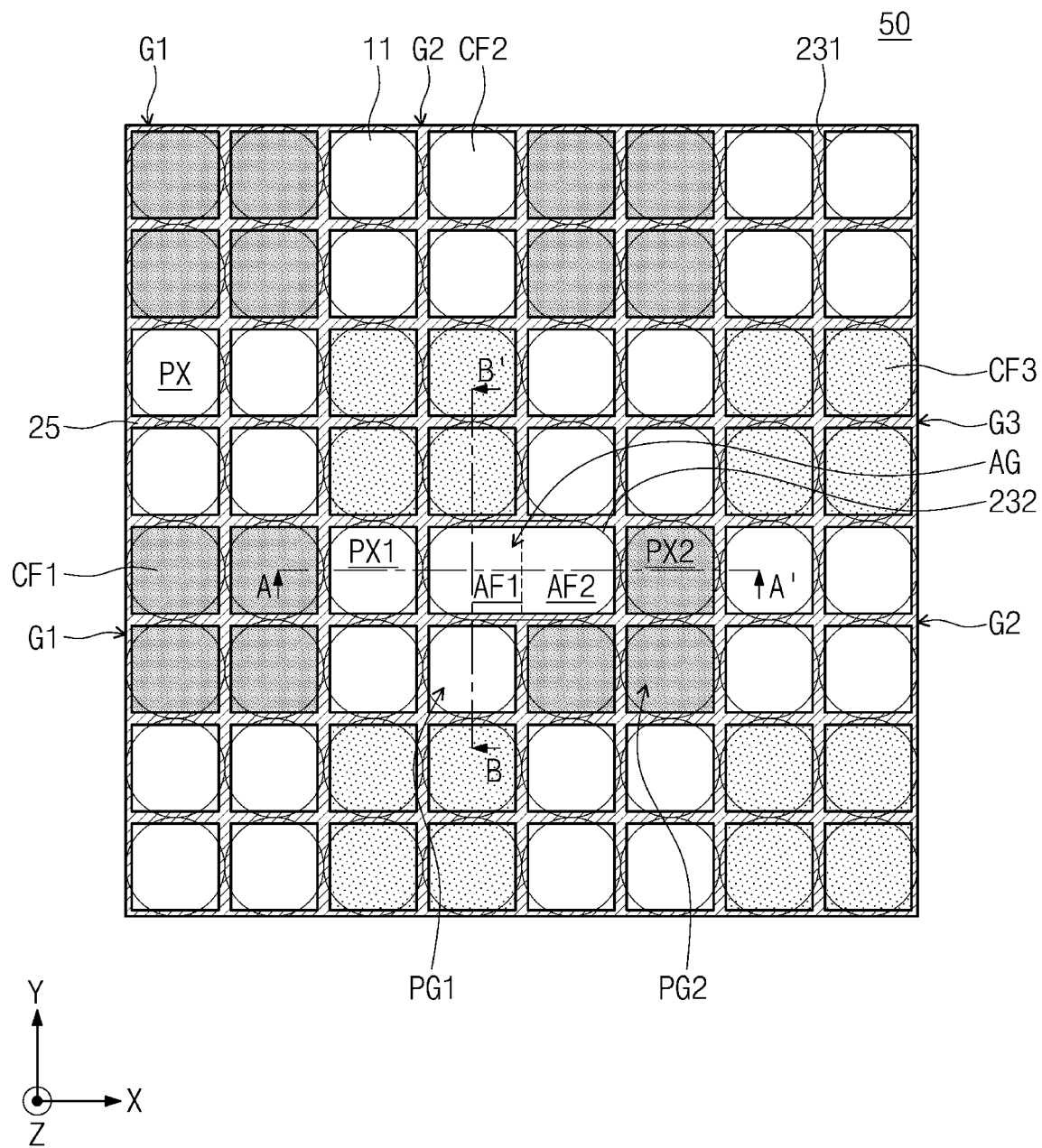
Figure 2A:
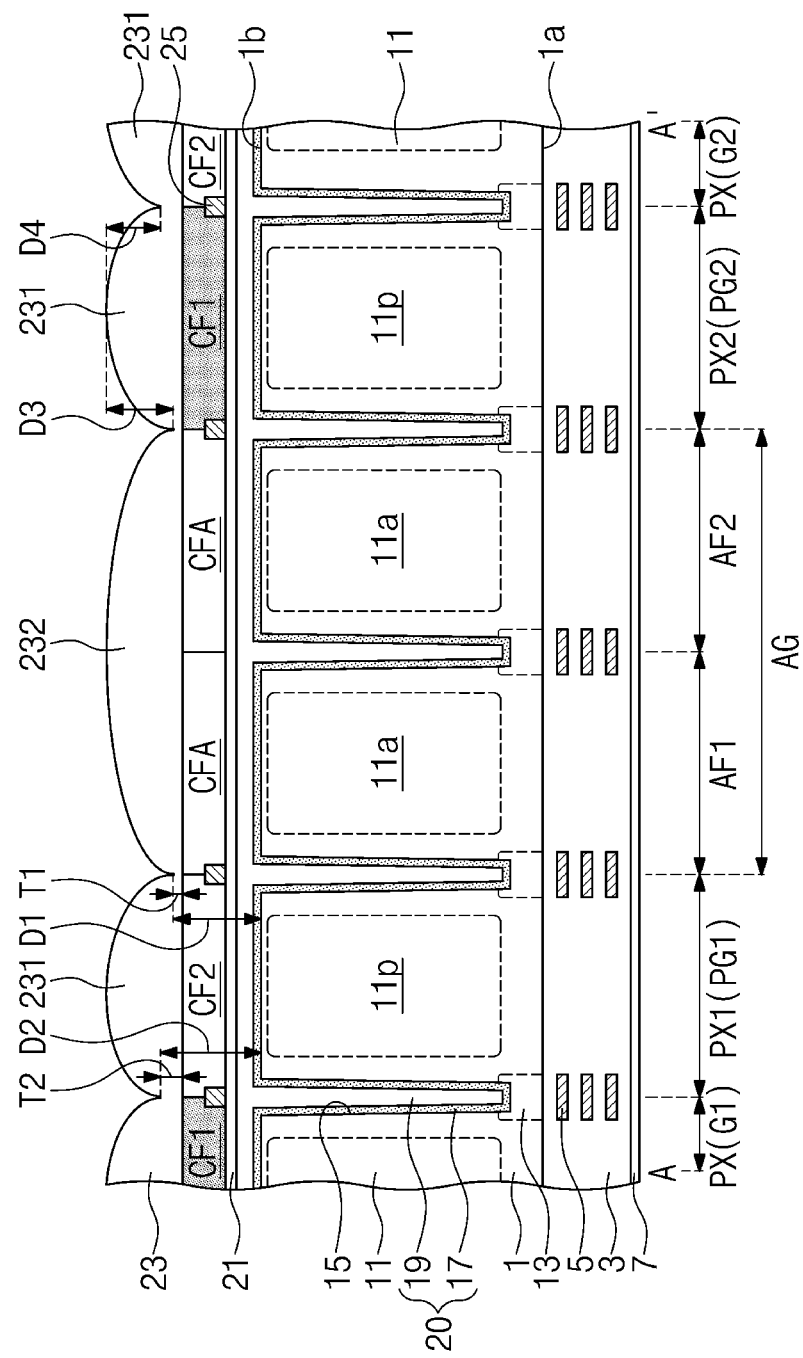
FIG. 2A is a sectional view taken along a line A-A' of FIG. 1A or FIG. 1B.
Figure 2B:
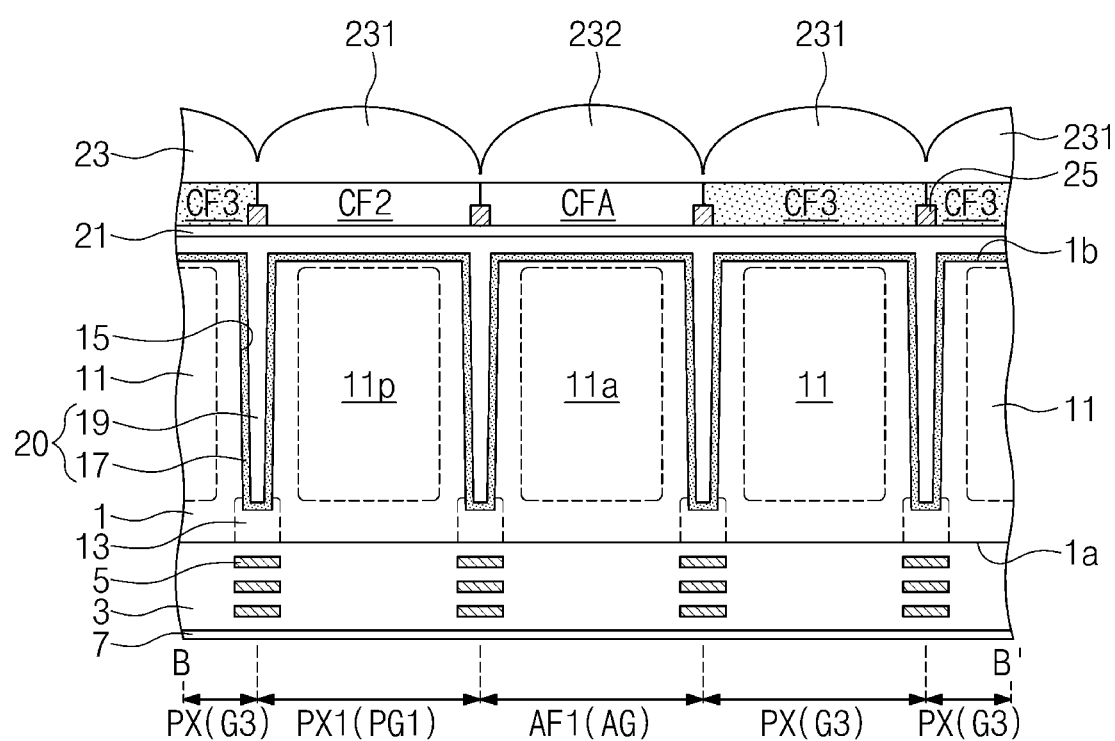
FIG. 2B is a sectional view taken along a line B-B' of FIG. 1A or FIG. 1B.

FIGS. 1A and 1B are plan views illustrating an image sensors 50 according to an exemplary embodiment. FIG. 2A is a sectional view taken along a line A-A' of FIG. 1A or FIG. 1B. FIG. 2B is a sectional view taken along a line B-B' of FIG. 1A or FIG. 1B. FIGS. 1A and 1B are plan views illustrating the same image sensor, where a border between pixel groups is clearly illustrated in FIG. 1A and a planar shape of a light-blocking pattern is clearly illustrated in FIG. 1B.

Referring to FIGS. 1A, 1B, 2A, and 2B, an image sensor 50 according to the present exemplary embodiment may include a substrate 1 with two opposite surfaces (e.g., a first surface 1a and a second surface 1b). Light may be incident on the second surface 1b. The substrate 1 may be a single crystalline semiconductor substrate or an epitaxially-grown semiconductor layer. The substrate 1 may be doped with impurities to have a first conductivity type. For example, the substrate 1 may be doped with p-type impurities. Pixel groups G1, G2, G3, PG1, PG2, and AG may be two-dimensionally arranged in the substrate 1. Each of the pixel groups G1, G2, G3, PG1, PG2, and AG may include a plurality of pixels PX, PX1, PX2, AF1, and AF2.

In detail, the pixel groups G1, G2, G3, PG1, PG2, and AG may include first image pixel groups G1, second image pixel groups G2, third image pixel groups G3, a first peripheral image pixel group PG1, a second peripheral image pixel group PG2, and an auto-focus (AF) pixel group AG. The first image pixel groups G1 and the second peripheral image pixel group PG2 may be configured to sense a first light. The second image pixel groups G2 and the first peripheral image pixel group PG1 may be configured to sense a second light. The third image pixel groups G3 may be configured to sense a third light. The AF pixel group AG may be configured to detect a phase.

In the case where each of the image pixel groups G1, G2, and G3 includes n×m image pixels PX arranged in the form of an n×m matrix (n columns and m rows), each of the first peripheral image pixel group PG1 and the second peripheral image pixel group PG2 may include b number of peripheral image pixels PX1 and PX2, where b is a natural number greater than or equal to (n×m)/2 and less than or equal to (n×m)−1. The numbers n and m may each be independently a natural number that is greater than or equal to 2. When each of the numbers n and m is 2, the image sensor may have a 2×2 tetra-type pixel (or color filter) arrangement. When each of the numbers n and m is 3, the image sensor may have a 3×3 nona-type pixel (or color filter) arrangement.

In the present exemplary embodiment, as shown in FIGS. 1A, 1B, 2A, and 2B, each of the image pixel groups G1, G2, and G3 may have four image pixels PX, which are arranged in the form of a 2×2 matrix (2 columns and 2 rows). The AF pixel group AG may have two pixels, which are arranged in the form of a 2×1 matrix. The first peripheral image pixel group PG1 may include three first peripheral image pixels PX1. The second peripheral image pixel group PG2 may include three second peripheral image pixels PX2.

In a first direction X, the first peripheral image pixel group PG1 may be interposed between the first image pixel group G1 and the AF pixel group AG. The second peripheral image pixel group PG2 may be interposed between the second image pixel group G2 and the AF pixel group AG. The AF pixel group AG may include a first AF pixel AF1 adjacent to the first peripheral image pixel group PG1 and a second AF pixel AF2 adjacent to the second peripheral image pixel group PG2. The second AF pixel AF2 may be disposed near (or adjacent to) the first AF pixel AF1 in the first direction X. The AF pixel group AG may be referred to as a phase detection pixel group. The first AF pixel AF1 may be referred to as a first phase detection pixel. The second AF pixel AF2 may be referred to as a second phase detection pixel.

The first peripheral image pixel group PG1 may have a structure in which one pixel is omitted from the pixels of the second image pixel group G2 in the form of a 2×2 matrix. The second peripheral image pixel group PG2 may have a structure in which one pixel is omitted from the 2×2 pixels of the first image pixel group G1. A portion of the first peripheral image pixel group PG1 may be in contact with a portion of the second peripheral image pixel group PG2.

That is, a pair of pixels, which are respectively selected from an adjacent pair of the first image pixel group G1 and the second image pixel group G2, may be used as the first AF pixel AF1 and the second AF pixel AF2 constituting the AF pixel group AG. Each of the adjacent pair of the first image pixel group G1 and the second image pixel group G2 lacks of one pixel as compared to other first image pixel groups G1 and second image pixel groups G2, so that the adjacent pair of the first image pixel group G1 and the second image pixel group G2 may be used as the second peripheral image pixel group PG2 and the first peripheral image pixel group PG1, respectively.

The pixels PX, PX1, PX2, AF1, and AF2 may be separated from each other by a deep device isolation structure 20. Each of the pixels PX, PX1, PX2, AF1, and AF2 may have a size of 0.8 μm or less. For example, each of the pixels PX, PX1, PX2, AF1, and AF2 may have a size of 0.6 μm-0.7 μm. By way of another example, each of the pixels PX, PX1, PX2, AF1, and AF2 may have a size of 0.5 μm-0.6 μm.

The deep device isolation structure 20 may be disposed in a deep trench 15, which is formed in the substrate 1. The deep trench 15 may be formed to extend from the second surface 1b of the substrate 1 toward the first surface 1a. The deep device isolation structure 20 may include a fixed charge layer 17 and an insulating gapfill layer 19. The fixed charge layer 17 may conformally cover an inner sidewall of the deep trench 15. The fixed charge layer 17 may be extended outward from the deep trench 15 to cover the second surface 1b of the substrate 1. The insulating gapfill layer 19 may fill the deep trench 15. The insulating gapfill layer 19 may be extended outward from the deep trench 15 to cover the second surface 1b of the substrate 1.

The fixed charge layer 17 may be formed of a metal oxide layer, having an oxygen content that is lower than its stoichiometric ratio, or a metal fluoride layer, having a fluorine content ratio that is lower than its stoichiometric ratio. Accordingly, the fixed charge layer 17 may have a negative fixed charge. The fixed charge layer 17 may be formed of metal oxide or metal fluoride containing at least one metal selected from the group consisting of hafnium (Hf), zirconium (Zr), aluminum (Al), tantalum (Ta), titanium (Ti), yttrium (Y), and lanthanoid. In this case, hole accumulation may occur near the fixed charge layer 17. Thus, it may be possible to effectively prevent or suppress dark current and white spot issues from occurring. In an exemplary embodiment, the fixed charge layer 17 may be at least one of aluminum oxide and hafnium oxide. The fixed charge layer 17 may be in contact with the substrate 1. The insulating gapfill layer 19 may be formed of a silicon oxide-based material with a good gap-filling property.

Transistors may be disposed on the first surface 1a of the substrate 1. The transistors may include a transfer transistor, a reset transistor, a source follower transistor, and a selection transistor. The first surface 1a of the substrate 1 may be covered with an interlayered insulating layer 3. The interlayered insulating layer 3 may have a multi-layered structure including a plurality of insulating layers. Interconnection lines 5 having a multi-layered structure may be disposed in the interlayered insulating layer 3. The interlayered insulating layer 3 may be covered with a passivation layer 7. The passivation layer 7 may include a silicon nitride layer.

A device isolation region 13 may be disposed in the substrate 1 and near the first surface 1a. The device isolation region 13 may be doped to have the same conductivity type as that of the substrate 1, although it is understood that one or more other exemplary embodiments are not limited thereto. For example, according to another exemplary embodiment, the device isolation region 13 may be doped to have a doping concentration higher than that of the substrate 1. In an exemplary embodiment, the device isolation region 13 may be doped with p-type impurities. The deep device isolation structure 20 may be in contact with the device isolation region 13.

The pixels PX, PX1, PX2, AF1, and AF2 may include photoelectric conversion portions 11, 11p, and 11a, which are provided in the substrate 1. In detail, each of the image pixels PX of the first to third image pixel groups G1, G2, and G3 may include a photoelectric conversion portion 11. Each of the peripheral image pixels PX1 and PX2 of the peripheral image pixel groups PG1 and PG2 may include a peripheral photoelectric conversion portion 11p. Each of the AF pixels AF1 and AF2 of the AF pixel group AG may include an AF photoelectric conversion portion 11a. In an exemplary embodiment, when viewed in a plan view, the photoelectric conversion portions 11, 11p, and 11a may have the same area. The photoelectric conversion portions 11, 11p, and 11a may be doped to have a different conductivity type from that of the substrate 1. For example, the photoelectric conversion portions 11, 11p, and 11a may be doped with n-type impurities.

An auxiliary insulating layer 21 may be disposed on the second surface 1b of the substrate 1 to cover the insulating gapfill layer 19. The auxiliary insulating layer 21 may be used as an adhesive layer, an anti-reflection layer, and/or a planarization layer. The auxiliary insulating layer 21 may include at least one of an aluminum oxide layer, a silicon nitride layer, or an organic insulating layer.

A light-blocking pattern 25 may be disposed between the pixels PX, PX1, PX2, AF1, AF2 and on the auxiliary insulating layer 21. The light-blocking pattern 25 may be formed of or include at least one of metallic materials, such as tungsten and titanium. The light-blocking pattern 25 may prevent a cross-talk issue from occurring between adjacent ones of the pixels PX, PX1, PX2, AF1, AF2. In detail, the light-blocking pattern 25 may be disposed between the image pixels PX, between the peripheral image pixels PX1 and PX2, between the image pixels PX and the peripheral image pixels PX1 and PX2, and between the AF pixels AF1 and AF2 and the peripheral image pixels PX1 and PX2, on the auxiliary insulating layer 21. When viewed in a plan view, the light-blocking pattern 25 may have a grid shape. The light-blocking pattern 25 may not be provided on the auxiliary insulating layer 21, between the first AF pixel AF1 and the second AF pixel AF2.

Between the light-blocking patterns 25 and on the auxiliary insulating layer 21, color filters CF1, CF2, CF3, and CFA may be disposed in an array shape. In the first image pixel groups G1 and the second peripheral image pixel group PG2, first color filters CF1 may be disposed on the auxiliary insulating layer 21. In the second image pixel groups G2 and the first peripheral image pixel group PG1, second color filters CF2 may be disposed on the auxiliary insulating layer 21. In the third image pixel groups G3, third color filters CF3 may be disposed on the auxiliary insulating layer 21. In the AF pixel group AG, AF color filters CFA may be disposed on the auxiliary insulating layer 21. The second color filters CF2 may be, for example, green. The AF color filters CFA may be, for example, green or colorless transparent. The first color filters CF1 may be, for example, red and the third color filters CF3 may be, for example, blue. It is understood that this is just an example, and one or more other exemplary embodiments are not limited thereto. For example, according to another exemplary embodiment, the third color filters CF3 may be red and the first color filters CF1 may be blue. The color filters CF1, CF2, CF3, and CFA may include dye materials to display their own colors.

A micro lens array layer 23 may be disposed on the color filters CF1, CF2, CF3, and CFA. The micro lens array layer 23 may include first micro lens portions 231, which are disposed on the image pixels PX and the peripheral image pixels PX1 and PX2, and a second micro lens portion 232, which is disposed on the AF pixels AF1 and AF2. The first micro lens portions 231 may have a circular shape when viewed in a plan view, and may have a semi-spherical section. The second micro lens portion 232 may have an elliptical shape with a major axis parallel to the first direction X, when viewed in a plan view, and one second micro lens portion 232 may cover both of the first AF pixel AF1 and the second AF pixel AF2, which are adjacent to each other.

A thickness of the micro lens array layer 23 may vary depending on position. A first thickness T1 of the micro lens array layer 23 between the second micro lens portion 232 and the first micro lens portions 231 adjacent thereto may be less than a second thickness T2 of the micro lens array layer 23 between the first micro lens portions 231.

In detail, the micro lens array layer 23 may have a first thickness T1 between the first peripheral image pixel group PG1 and the AF pixel group AG. The micro lens array layer 23 may have a second thickness T2 between the first peripheral image pixel group PG1 and the first image pixel group G1 adjacent thereto. The first thickness T1 may be less than the second thickness T2.

A first distance D1 from a top end of the micro lens array layer 23 to the second surface 1b of the substrate 1, which is measured between the first peripheral image pixel group PG1 and the AF pixel group AG, may be less than a second distance D2 from a top end of the micro lens array layer 23 to the second surface 1b of the substrate 1, which is measured between the first peripheral image pixel group PG1 and the first image pixel group G1 adjacent thereto.

In one or more exemplary embodiments, a depth D3 of the micro lens array layer 23 between the second micro lens portion 232 and the first micro lens portions 231 adjacent thereto may be greater than a depth D4 of the micro lens array layer 23 between the first micro lens portions 231.

This difference in thickness, distance, or depth of the micro lens array layer 23 may be caused by a loading effect in an etching process for forming the micro lens array layer 23. For example, the formation of the micro lens array layer 23 may include forming a preliminary lens layer, which is made of a transparent polymer material, on the color filters CF1, CF2, CF3, and CFA and then forming preliminary lens patterns, which are arranged in an array shape, on the preliminary lens layer. Thereafter, an etching process may be performed to transcript the shape of the preliminary lens patterns onto the preliminary lens layer, and as a result, the micro lens array layer 23 may be formed. Here, the preliminary lens pattern for forming the second micro lens portion 232 may be larger than other preliminary lens patterns, and this may lead to a variation in an etching process condition (e.g., a density of an etching gas). As a result, a region around the second micro lens portion 232 may be more deeply etched, and this may lead to the above-described difference in thickness, distance, or depth of the micro lens array layer 23.

In an exemplary embodiment, the image sensor 50 may include a plurality of the AF pixel groups AG, and the total number of the first and second AF pixels AF1 and AF2 constituting the AF pixel groups AG may be 0.5%-10% of the total number of the pixels PX, PX1, PX2, AF1, and AF2.

The image sensor 50 according to an exemplary embodiment may include the image pixel groups G1, G2, G3, which have the "n×m" pixel arrangement, and the AF pixel group AG, which detects a phase in a shared-on-chip-lens manner. A focus of the obtained image may be adjusted by comparing a phase difference between images, which are respectively sensed by the first and second AF pixels AF1 and AF2. This may be used to realize an auto-focusing function of the image sensor 50. Here, since the light-blocking pattern 25 is absent between the first AF pixel AF1 and the second AF pixel AF2 of the AF pixel group AG, an amount of light incident on the first AF pixel AF1 and the second AF pixel AF2 may be increased. Accordingly, even when the number of the AF pixel groups AG is small, it may be possible to improve phase detection efficiency.

Furthermore, in the image sensor 50 according to an exemplary embodiment, the AF pixel group AG may be disposed to span the first image pixel group G1 and the second image pixel group G2, which are adjacent to each other. In other words, the AF pixel group AG may be configured using some pixels of the first image pixel group G1 and the second image pixel group G2, which are adjacent to each other. Alternatively, due to the AF pixel group AG, the first peripheral image pixel group PG1 and the second peripheral image pixel group PG2 may include a number of pixels that is less than the number of pixels in each of the image pixel groups G1, G2, and G3. According to this disposition, it may be possible to increase signal processing efficiency and to improve binning and high-dynamic-range (HDR) characteristics.

Figure 3:
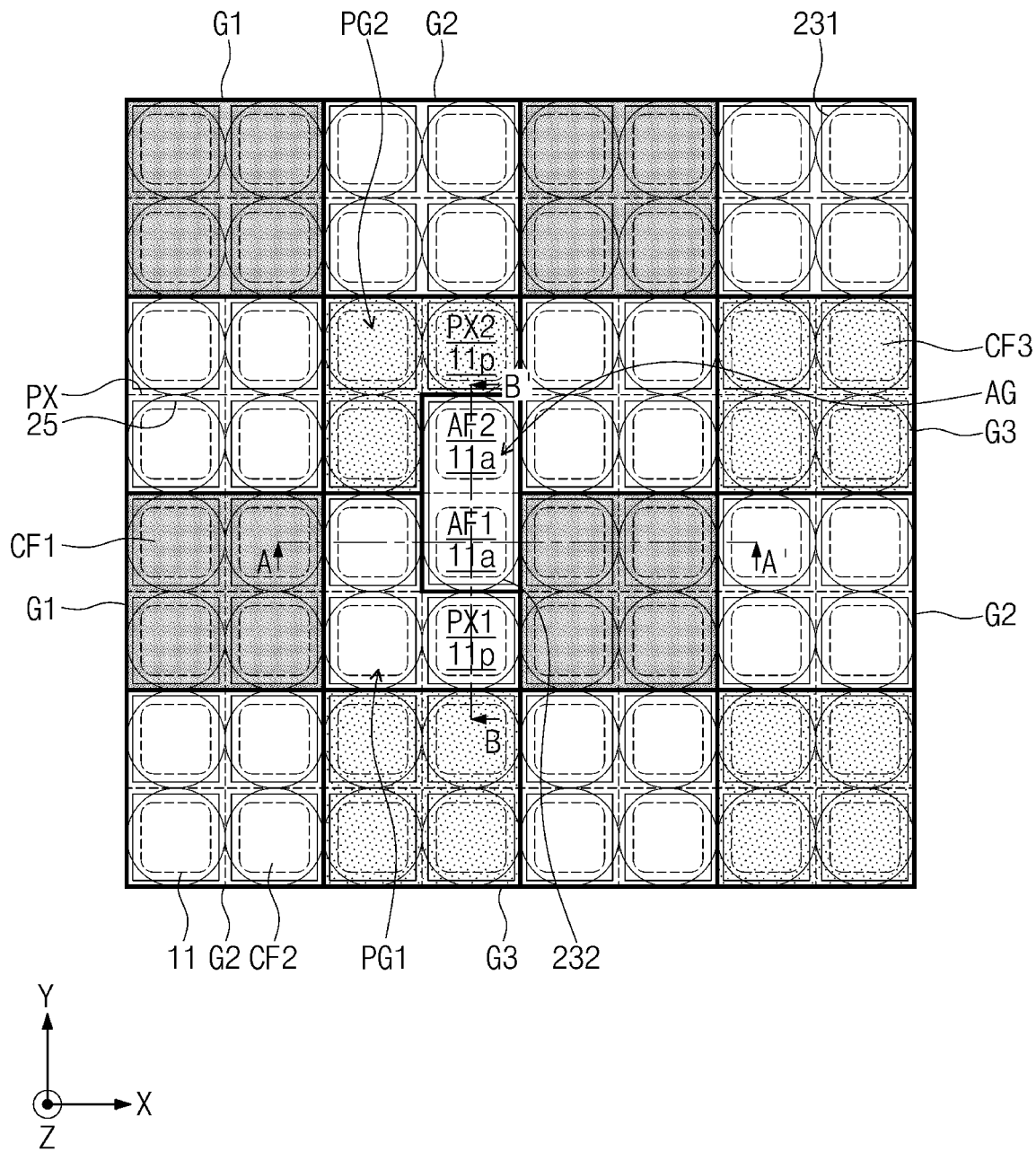
FIG. 3 is a plan view illustrating an image sensor according to an exemplary embodiment.
Figure 4A:
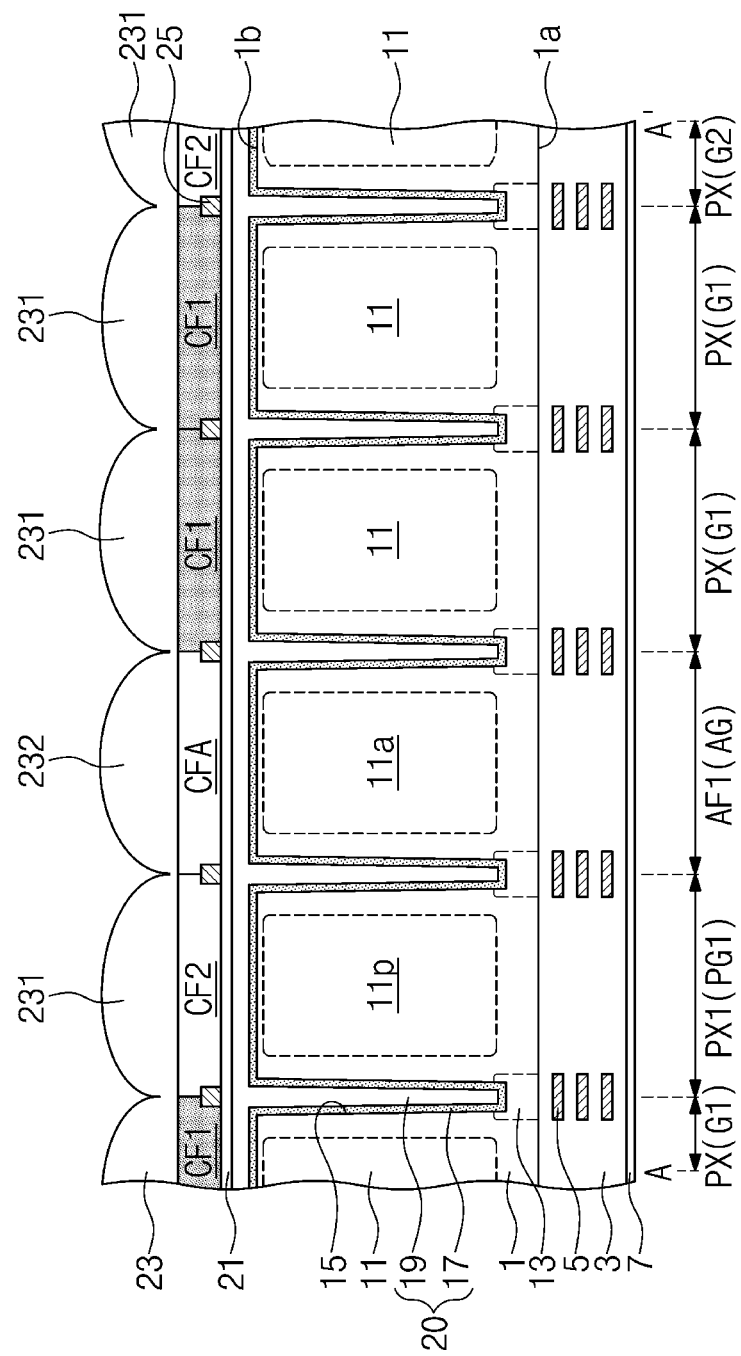
FIG. 4A is a sectional view taken along a line A-A' of FIG. 3.
Figure 4B:
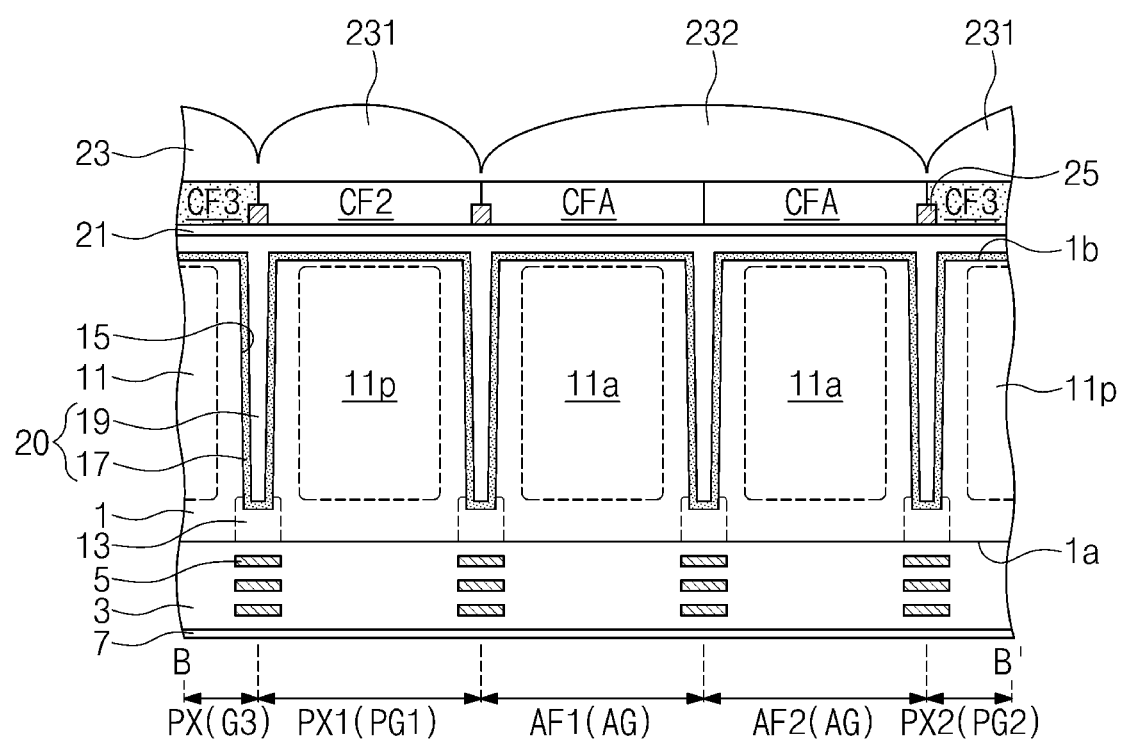
FIG. 4B is a sectional view taken along a line B-B' of FIG. 3.

FIG. 3 is a plan view illustrating an image sensor 51 according to an exemplary embodiment. FIG. 4A is a sectional view taken along a line A-A' of FIG. 3. FIG. 4B is a sectional view taken along a line B-B' of FIG. 3.

Referring to FIGS. 3, 4A, and 4B, in an image sensor 51 according to the present exemplary embodiment, the first peripheral image pixel group PG1 may be interposed between the third image pixel group G3 and the AF pixel group AG, when viewed in a second direction Y. In addition, the second peripheral image pixel group PG2 may be disposed between the second image pixel group G2 and the AF pixel group AG. The first image pixel groups G1 may be configured to sense a first light. The second image pixel groups G2 and the first peripheral image pixel group PG1 may be configured to sense a second light. The third image pixel groups G3 and the second peripheral image pixel group PG2 may be configured to sense a third light. The AF pixel group AG may be configured to detect a phase.

The AF pixel group AG may include the first AF pixel AF1 adjacent to the first peripheral image pixel group PG1 and the second AF pixel AF2 adjacent to the second peripheral image pixel group PG2. The second AF pixel AF2 may be disposed near the first AF pixel AF1 in the second direction Y.

The first peripheral image pixel group PG1 may have a structure in which one pixel is omitted from the 2×2 pixels of the second image pixel group G2. The second peripheral image pixel group PG2 may have a structure in which one pixel is omitted from the 2×2 pixels of the third image pixel group G3. A portion of the first peripheral image pixel group PG1 may be in contact with a portion of the second peripheral image pixel group PG2.

That is, a pair of pixels, which are respectively selected from an adjacent pair of the second image pixel group G2 and the third image pixel group G3, may be used as the first AF pixel AF1 and the second AF pixel AF2 constituting the AF pixel group AG. Each of the adjacent pair of the second image pixel group G2 and the third image pixel group G3 lacks one pixel as compared to other second image pixel groups G2 and third image pixel groups G3, so that the adjacent pair of the second image pixel group G2 and the third image pixel group G3 may be used as the first peripheral image pixel group PG1 and the second peripheral image pixel group PG2, respectively.

The light-blocking pattern 25 may be disposed between the pixels and on the auxiliary insulating layer 21. The light-blocking pattern 25 may not be provided on the auxiliary insulating layer 21 between the first AF pixel AF1 and the second AF pixel AF2.

The first color filters CF1 may be disposed on the auxiliary insulating layer 21 and in the first image pixel groups G1, respectively. The second color filters CF2 may be disposed on the auxiliary insulating layer 21 and in the second image pixel groups G2 and the first peripheral image pixel group PG1, respectively. The third color filters CF3 may be disposed on the auxiliary insulating layer 21 and in the third image pixel groups G3 and the second peripheral image pixel group PG2, respectively.

The micro lens array layer 23 may be disposed on the color filters CF1, CF2, CF3, and CFA. The micro lens array layer 23 may include the first micro lens portions 231, which are disposed on the image pixels PX and the peripheral image pixels PX1 and PX2, and the second micro lens portion 232, which is disposed on the AF pixels AF1 and AF2. The first micro lens portions 231 may have a circular shape when viewed in a plan view, and may have a semi-spherical section. The second micro lens portion 232 may have an elliptical shape with a major axis parallel to the second direction Y, when viewed in a plan view, and one second micro lens portion 232 may cover both of the first AF pixel AF1 and the second AF pixel AF2, which are adjacent to each other. Except for these differences, the image sensor 51 according to the present exemplary embodiment may be the same as or similar to those in the exemplary embodiments described above with reference to FIGS. 1A, 1B, 2A, and 2B.

Figure 5:
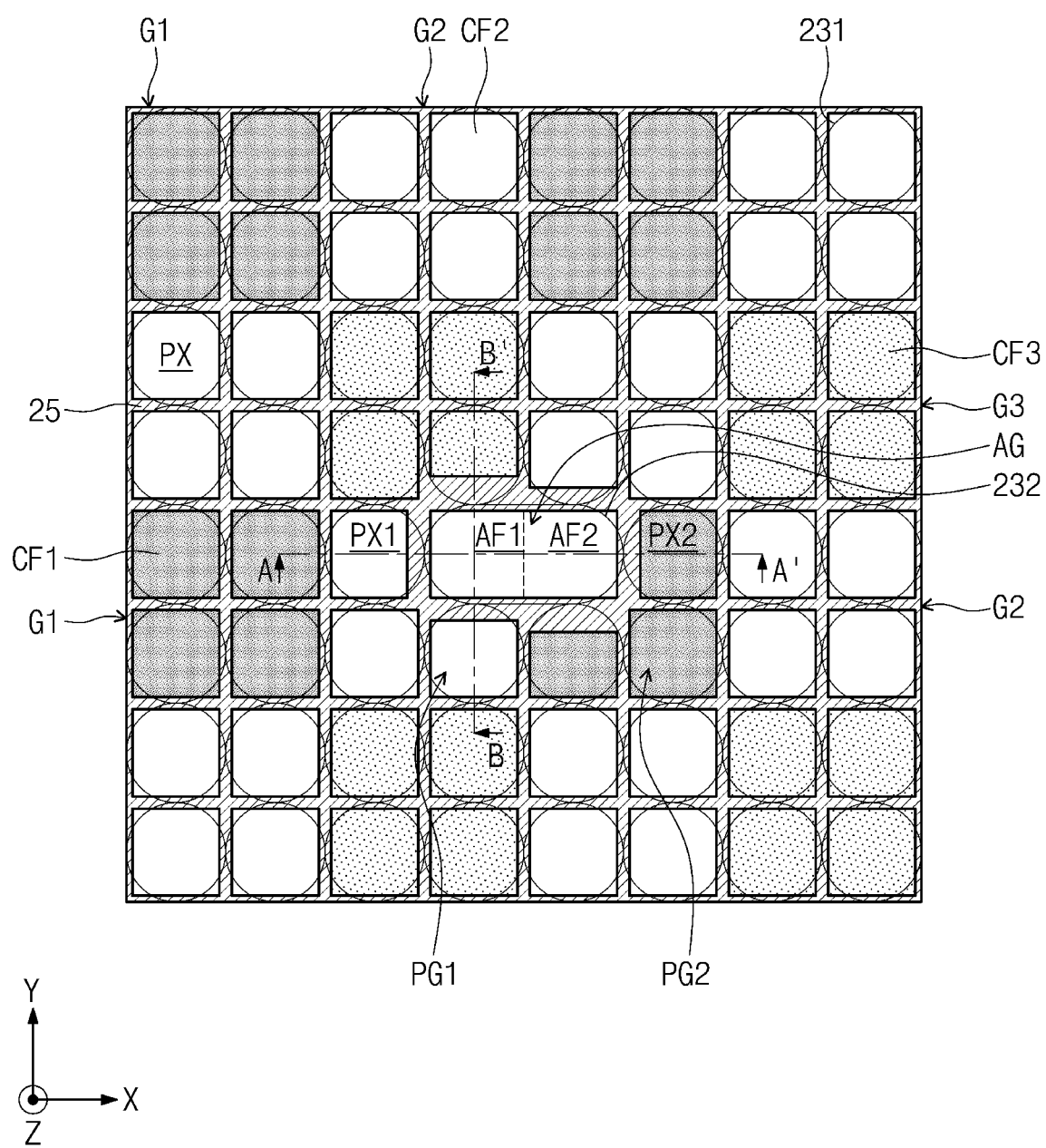
FIG. 5 is a plan view illustrating an image sensor according to an exemplary embodiment.
Figure 6A:
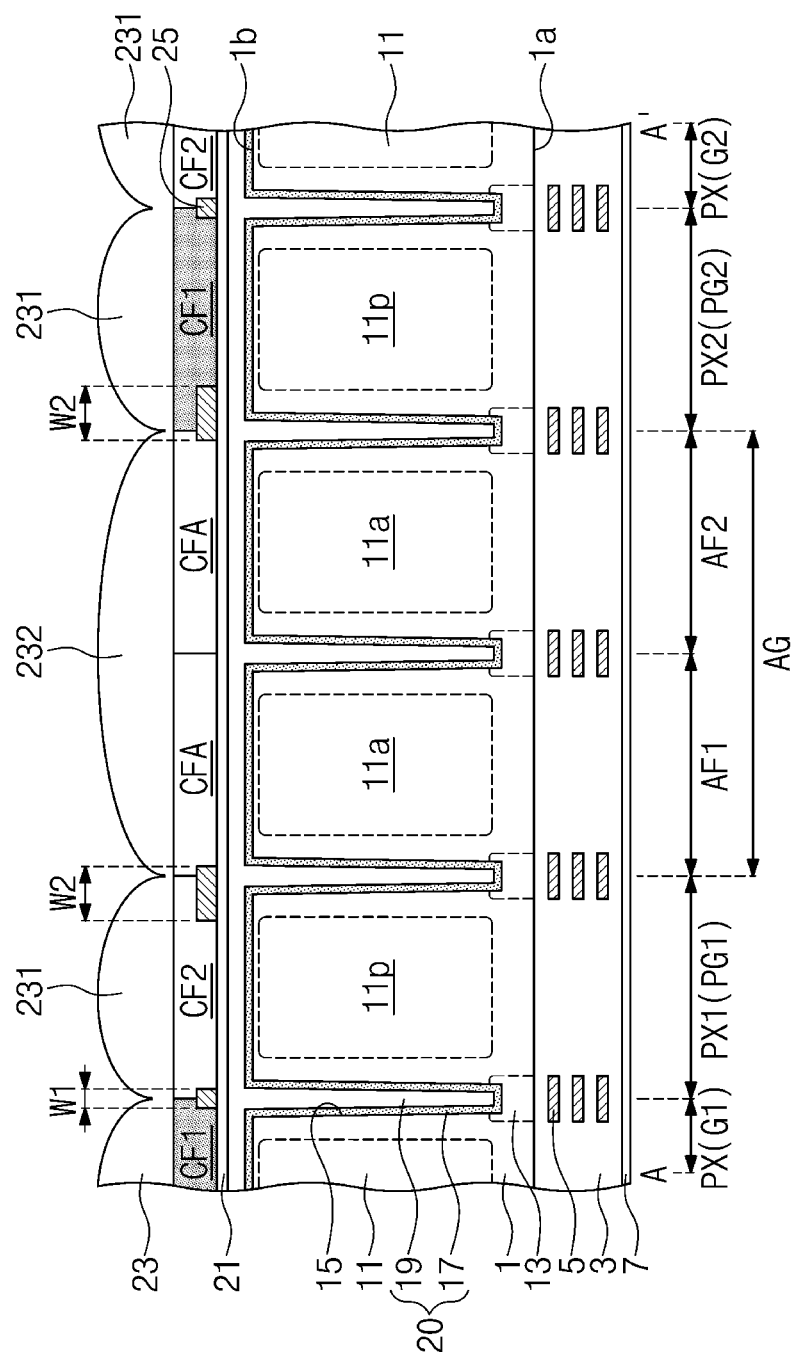
FIG. 6A is a sectional view taken along a line A-A' of FIG. 5.
Figure 6B:
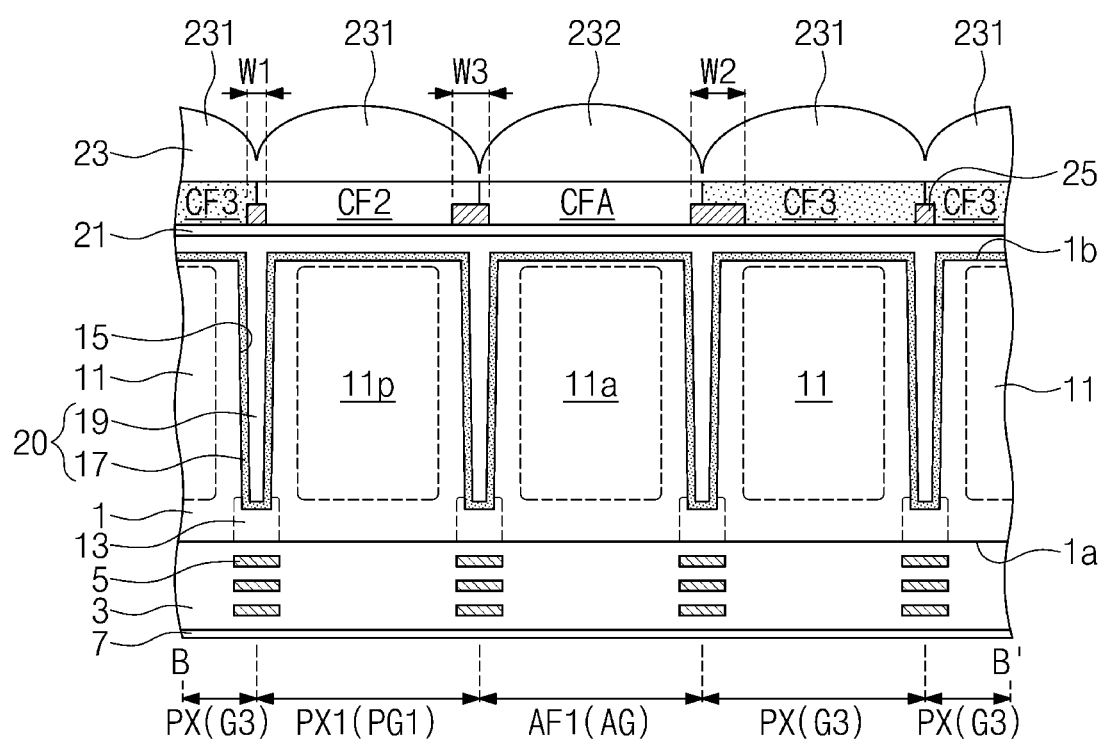
FIG. 6B is a sectional view taken along a line B-B' of FIG. 5.

FIG. 5 is a plan view illustrating an image sensor 52 according to an exemplary embodiment. FIG. 6A is a sectional view taken along a line A-A' of FIG. 5. FIG. 6B is a sectional view taken along a line B-B' of FIG. 5.

Referring to FIGS. 5, 6A, and 6B, the light-blocking pattern 25, which is disposed on the substrate 1 and between the image pixel groups G1, G2, and G3 spaced apart from the AF pixel group AG, may have a first width W1. However, the light-blocking pattern 25 adjacent to the AF pixel group AG may have widths W2 and W3, which are greater than the first width W1. In detail, the light-blocking pattern 25 that is located between the first AF pixel AF1 and the first peripheral image pixel PX1 adjacent thereto in the first direction X, may be extended toward the first peripheral image pixel PX1 and may have a second width W2. The light-blocking pattern 25 that is located between the second AF pixel AF2 and the second peripheral image pixel PX2 adjacent thereto in the first direction X, may be extended toward the second peripheral image pixel PX2 and may have the second width W2. The light-blocking pattern 25 that is located between the first AF pixel AF1 and the image pixel PX of the third image pixel group G3 adjacent thereto in the second direction Y, may be extended toward the third image pixel group G3 and may have the second width W2. The light-blocking pattern 25 that is located between the first AF pixel AF1 and the first peripheral image pixel PX1 adjacent thereto in the second direction Y, may be extended toward the first peripheral image pixel PX1 and may have a third width W3. The second width W2 and the third width W3 may be greater than the first width W1. The third width W3 may be different from the second width W2. In this case, due to the light-blocking pattern 25, it may be possible to reduce opening ratios of the second image pixel group G2, the third image pixel group G3, the first peripheral image pixel group PG1, and the second peripheral image pixel group PG2, which are located adjacent to the AF pixel group AG.

As described above, the second micro lens portion 232 having a relatively large width may be disposed in the AF pixel group AG. In this case, a depth of the micro lens array layer 23 may be increased between the second micro lens portion 232 and the first micro lens portions 231 adjacent thereto. Due to this structure of the micro lens array layer 23, a relatively large amount of light may be incident on the image pixels PX, PX1, and PX2 of the second image pixel group G2, the third image pixel group G3, the first peripheral image pixel group PG1, and the second peripheral image pixel group PG2, adjacent to the AF pixel group AG, than on the image pixels PX of the image pixel groups G1, G2, and G3 spaced apart from (or not adjacent to) the AF pixel group AG. Thus, the image and sensitivity of the image pixels PX, PX1, and PX2 of the second image pixel group G2, the third image pixel group G3, the first peripheral image pixel group PG1, and the second peripheral image pixel group PG2, which are located adjacent to the AF pixel group AG, may differ from those of other image pixels PX, and this may lead to deterioration in uniformity of the overall image.

However, in an image sensor 52 according to the present exemplary embodiment, a width of the light-blocking pattern 25 may be adjusted to reduce opening ratios of the second image pixel group, the third image pixel group G3, the first peripheral image pixel group PG1, and the second peripheral image pixel group PG2, which are located adjacent to the AF pixel group AG. Accordingly, it may be possible to prevent a relatively large amount of light from being incident on the image pixels PX, PX1, and PX2 of the second image pixel group G2, the third image pixel group G3, the first peripheral image pixel group PG1, and the second peripheral image pixel group PG2, which are located adjacent to the AF pixel group AG, and thereby to obtain an overall uniform and clear image. That is, according to an exemplary embodiment, in order to prevent uniformity and sensitivity of the image pixel adjacent to the AF pixel from being deteriorated, by adjusting the width of the light-blocking pattern 25, it may be possible to obtain a desired pixel opening or aperture property. Due to the above features, the image sensor 52 according to an exemplary embodiment may have a high sensitivity property, even under a low illumination condition.

Figure 7A:
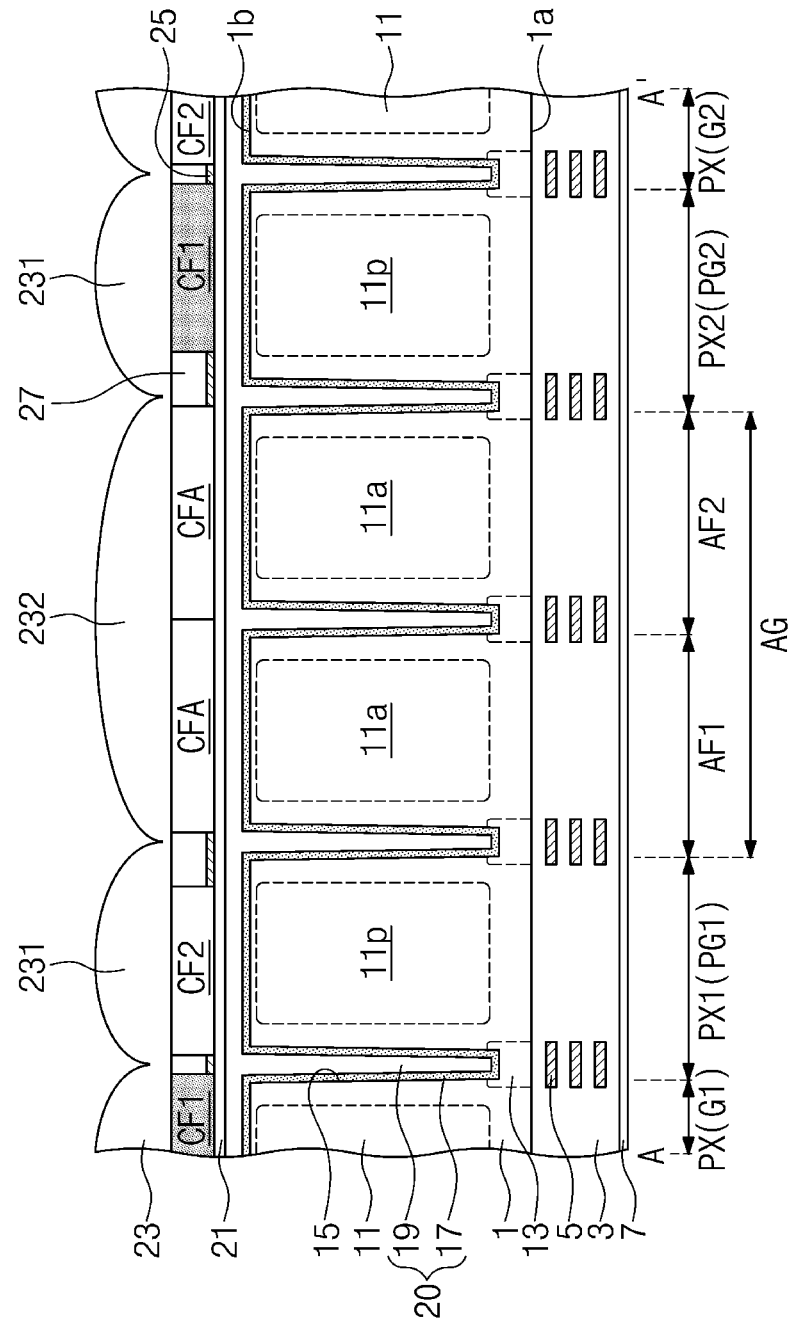
FIGS. 7A and 7B are sectional views taken along a line A-A' of FIG. 5.
Figure 7B:
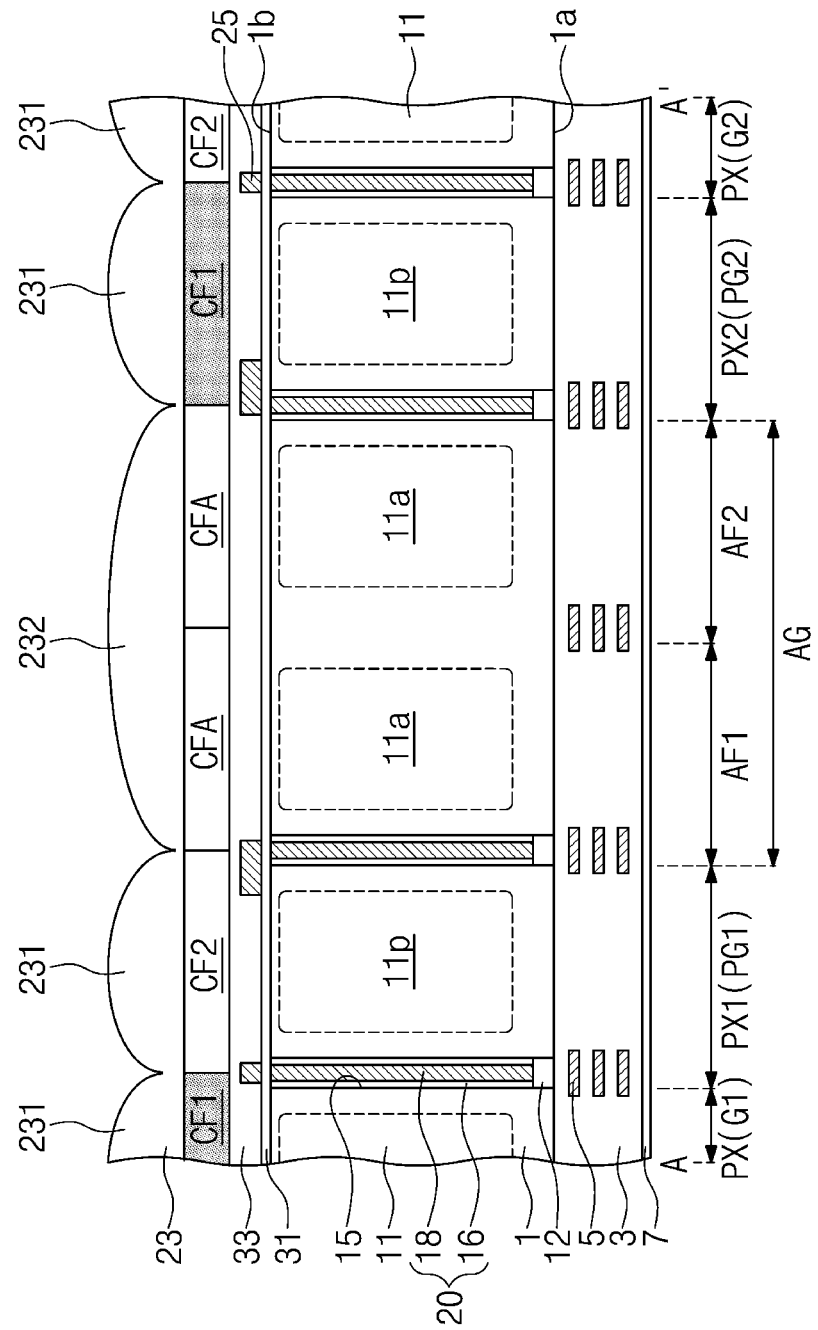

FIGS. 7A and 7B are sectional views taken along a line A-A' of FIG. 5.

Referring to FIG. 7A, in an image sensor according to the present exemplary embodiment, the light-blocking pattern 25 and a low refraction pattern 27 may be interposed between the color filters CF1, CF2, CF3, and CFA. A refractive index of the low refraction pattern 27 may be less than refractive indices of the color filters CF1, CF2, CF3, and CFA. In an exemplary embodiment, the refractive index of the low refraction pattern 27 may be less than or equal to 1.3. The low refraction pattern 27 may be formed of or include an organic material. A thickness of the low refraction pattern 27 may be greater than a thickness of the light-blocking pattern 25. Top surfaces of the color filters CF1, CF2, CF3, and CFA may be coplanar with a top surface of the low refraction pattern 27. The low refraction pattern 27 may have a grid shape, when viewed in a plan view. A width of the low refraction pattern 27 may be equal to a width of the light-blocking pattern 25. A side surface of the low refraction pattern 27 may be aligned to a side surface of the light-blocking pattern 25. Between the first AF pixel AF1 and the second AF pixel AF2, the low refraction pattern 27 may be absent on the substrate 1. In other words, the low refraction pattern 27 may not be interposed between the AF color filters CFA. Except for these differences, the image sensor according to the present exemplary embodiment may be the same as or similar to those in the above-described exemplary embodiments.

Referring to FIG. 7B, in an image sensor according to the present embodiment, the deep device isolation structure 20 may further include an insulating layer 16, which conformally covers the inner sidewall of the deep trench 15, and a conductive pattern 18, which is spaced apart from the substrate 1 by the insulating layer 16. The conductive pattern 18 may be applied with a negative voltage and may serve as a common bias line. A shallow device isolation layer 12 may be disposed in the substrate 1 and near the first surface 1*a*. A fixed charge layer 31 may cover the second surface 1*b* of the substrate 1. The light-blocking pattern 25 may be disposed on the fixed charge layer 31. The light-blocking pattern 25 and the fixed charge layer 31 may be covered with a planarization layer 33. The planarization layer 33 may include a transparent polymer layer. The color filters CF1, CF2, CF3, and CFA may be disposed on the planarization layer 33. Except for these differences, the image sensor according to the present exemplary embodiment may be the same as or similar to those in the above-described exemplary embodiments.

Figure 8:
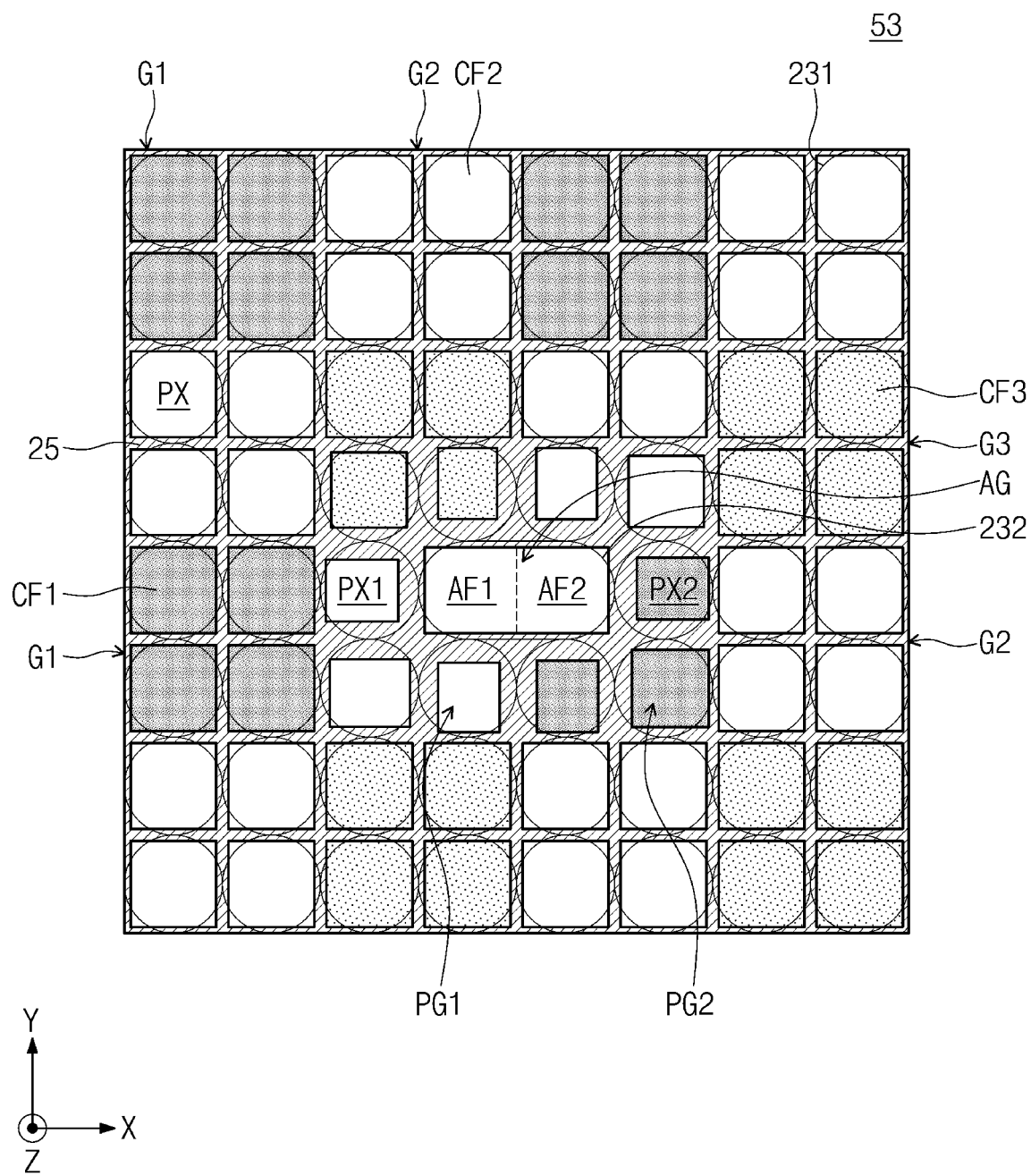
FIG. 8 is a plan view illustrating an image sensor according to an exemplary embodiment.

FIG. 8 is a plan view illustrating an image sensor 53 according to an exemplary embodiment.

An image sensor 53 of FIG. 8 may be similar to the image sensor 52 of FIG. 5, but a width of the light-blocking pattern 25 may be increased in borders of more pixels. An opening ratio delimited by the light-blocking pattern 25 may be decreased with decreasing distance from the AF pixel group AG. Opening ratios of pixels that are in contact with a sidewall of the AF pixel group AG, may be less than an opening ratio near a corner of the AF pixel group AG or opening ratios of pixels spaced apart therefrom. Furthermore, the opening ratio delimited by the light-blocking pattern 25 may be dependent on a color of a color filter. For example, opening ratios of first image pixels that are provided adjacent to the AF pixel group AG to have a color filter CF of a first color and to sense a first light, may be different from opening ratios of second image pixels that are provided adjacent to the AF pixel group AG to have the color filter CF of a second color and to sense a second light. Except for these differences, the image sensor 53 according to the present exemplary embodiment may be the same as or similar to those in the above-described exemplary embodiments.

Figure 9:
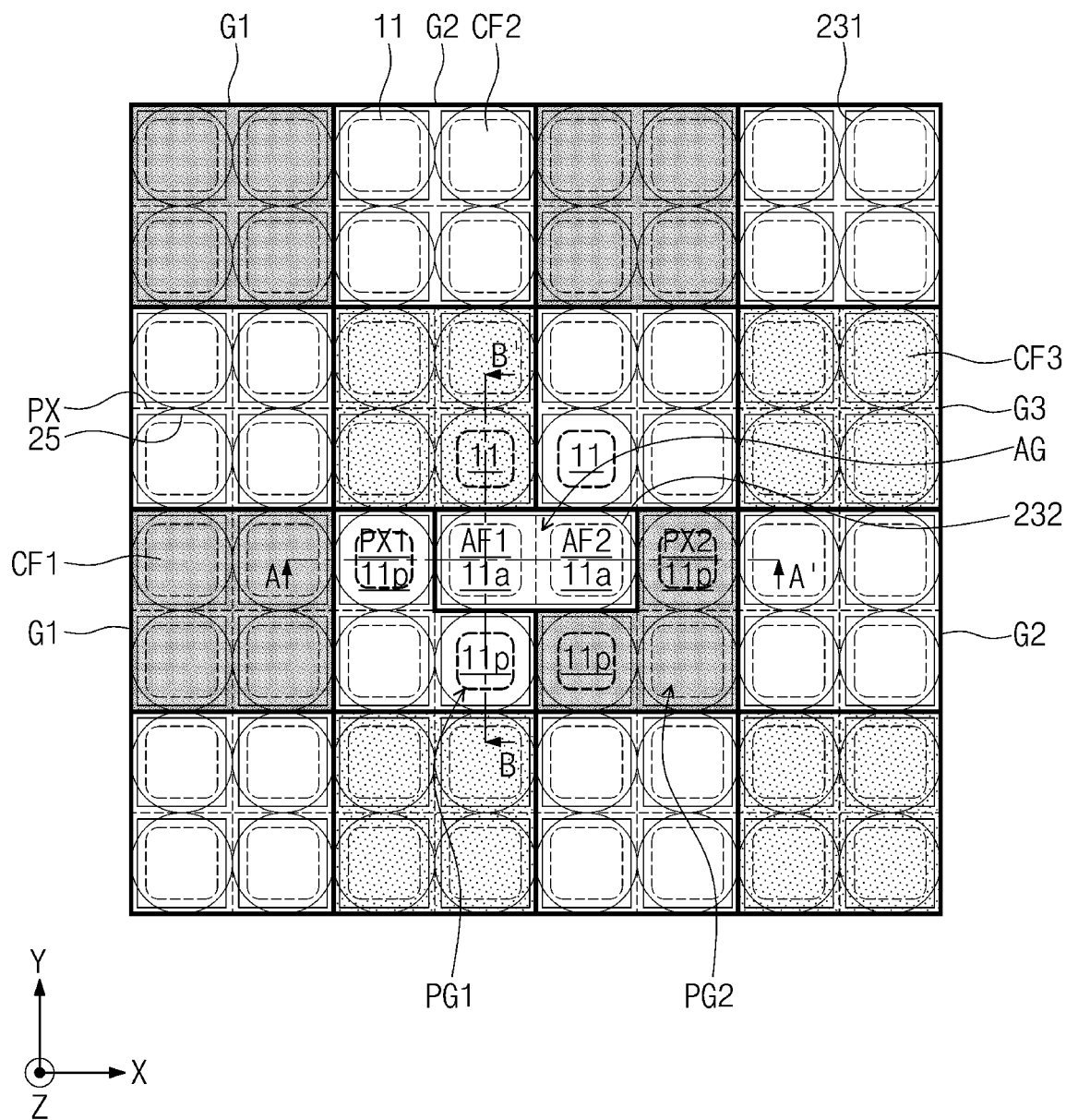
FIG. 9 is a plan view illustrating an image sensor according to an exemplary embodiment.
Figure 10A:
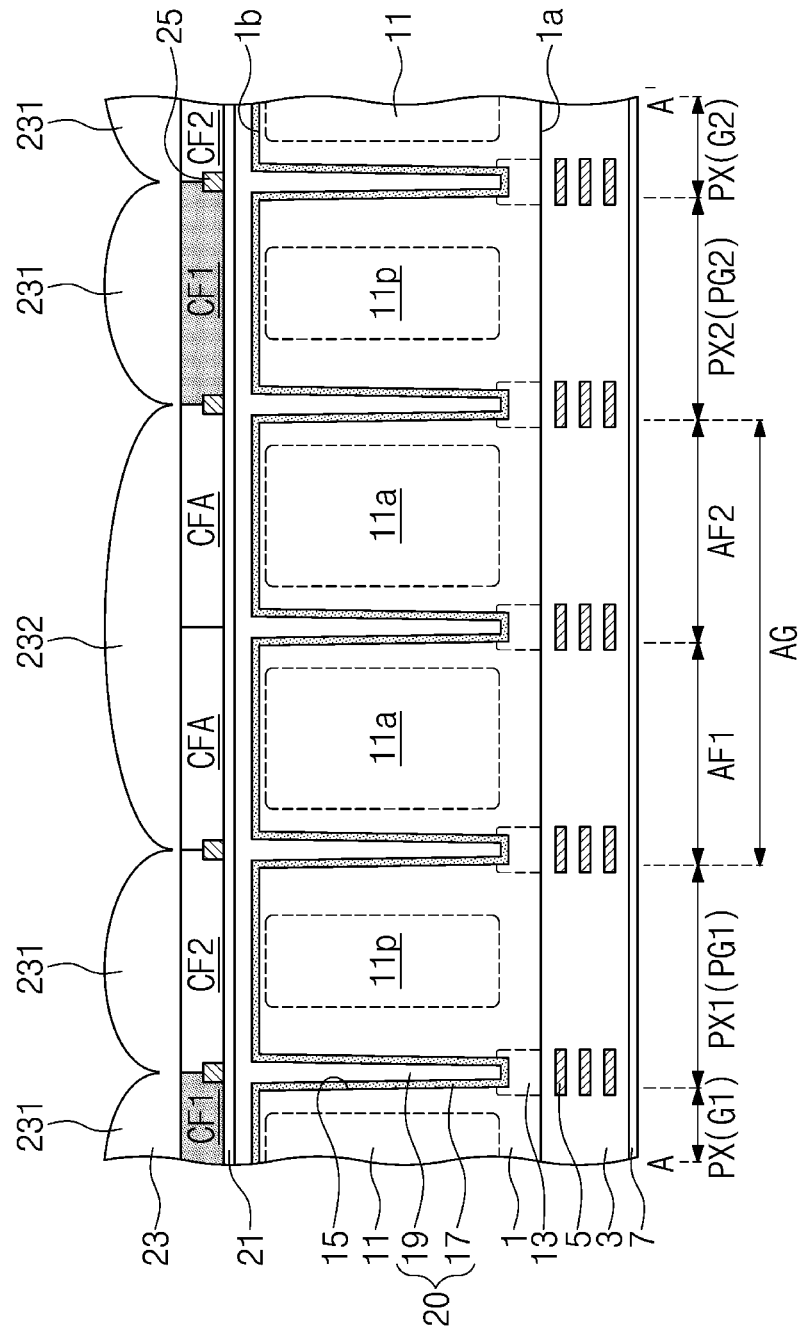
FIG. 10A is a sectional view taken along a line A-A' of FIG. 9.
Figure 10B:
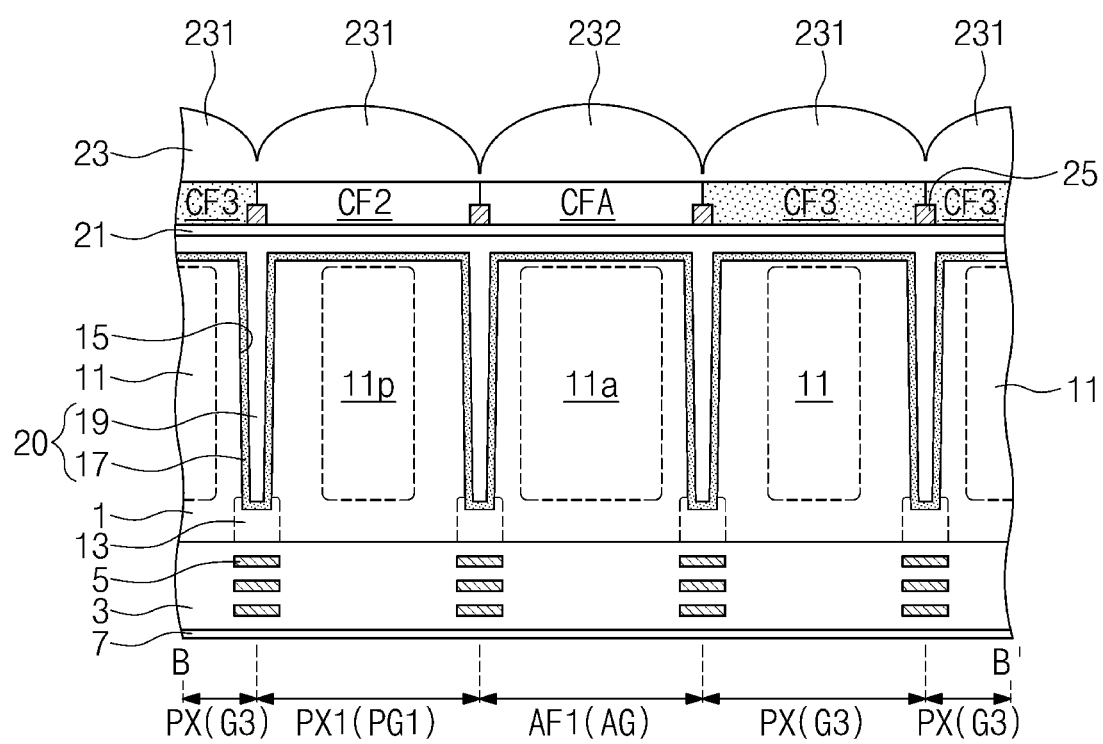
FIG. 10B is a sectional view taken along a line B-B' of FIG. 9.

FIG. 9 is a plan view illustrating an image sensor 54 according to an exemplary embodiment. FIG. 10A is a sectional view taken along a line A-A' of FIG. 9. FIG. 10B is a sectional view taken along a line B-B' of FIG. 9.

Referring to FIGS. 9, 10A, and 10B, in an image sensor 54 according to the present exemplary embodiment, areas of the photoelectric conversion portions 11 and 11*p* in the second image pixel group G2, the third image pixel group G3, the first peripheral image pixel group PG1, and the second peripheral image pixel group PG2, adjacent to the AF pixel group AG, may be smaller than areas of other photoelectric conversion portions 11 and 11*a*, when viewed in a plan view. That is, the areas of the peripheral photoelectric conversion portions 11*p* adjacent to the AF pixel group AG may be smaller than the areas of the AF photoelectric conversion portions 11*a*. In addition, the area of the photoelectric conversion portions 11 adjacent to the AF photoelectric conversion portions 11*a* may be smaller than the areas of the AF photoelectric conversion portions 11*a*. Accordingly, it may be possible to reduce light-receiving ratios of the image pixels PX, PX1, and PX2 of the second image pixel group G2, the third image pixel group G3, the first peripheral image pixel group PG1, and the second peripheral image pixel group PG2, which are located adjacent to the AF pixel group AG, and to thereby obtain an overall uniform and clear image. That is, according to an exemplary embodiment, a size of the photoelectric conversion portion may be adjusted to prevent uniformity and sensitivity of the image pixel adjacent to the AF pixel from being deteriorated. Due to the above features, the image sensor 54 according to an exemplary embodiment may have a high sensitivity property, even under a low illumination condition.

Figure 11:
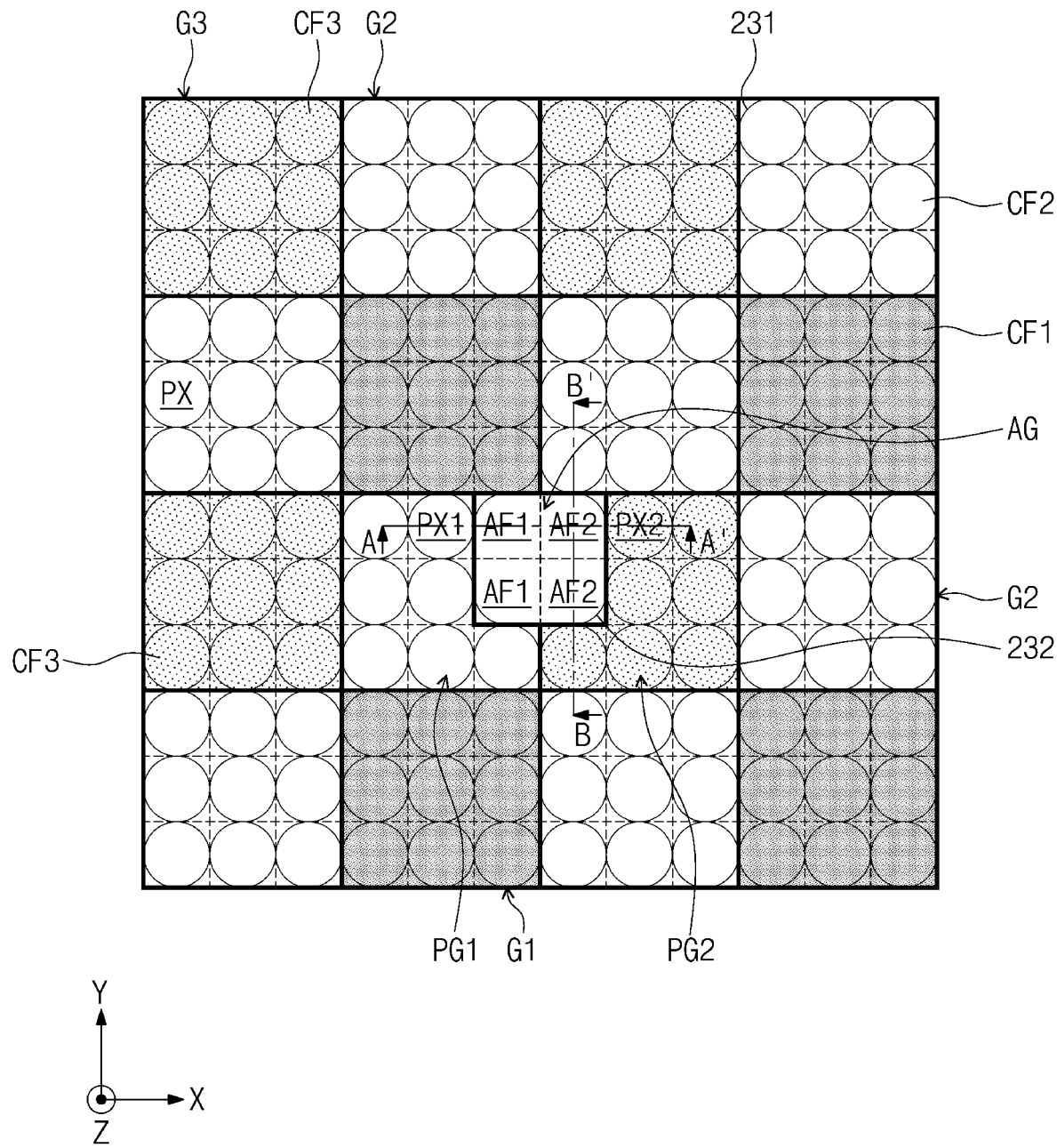
FIG. 11 is a plan view illustrating an image sensor according to an exemplary embodiment.
Figure 12A:
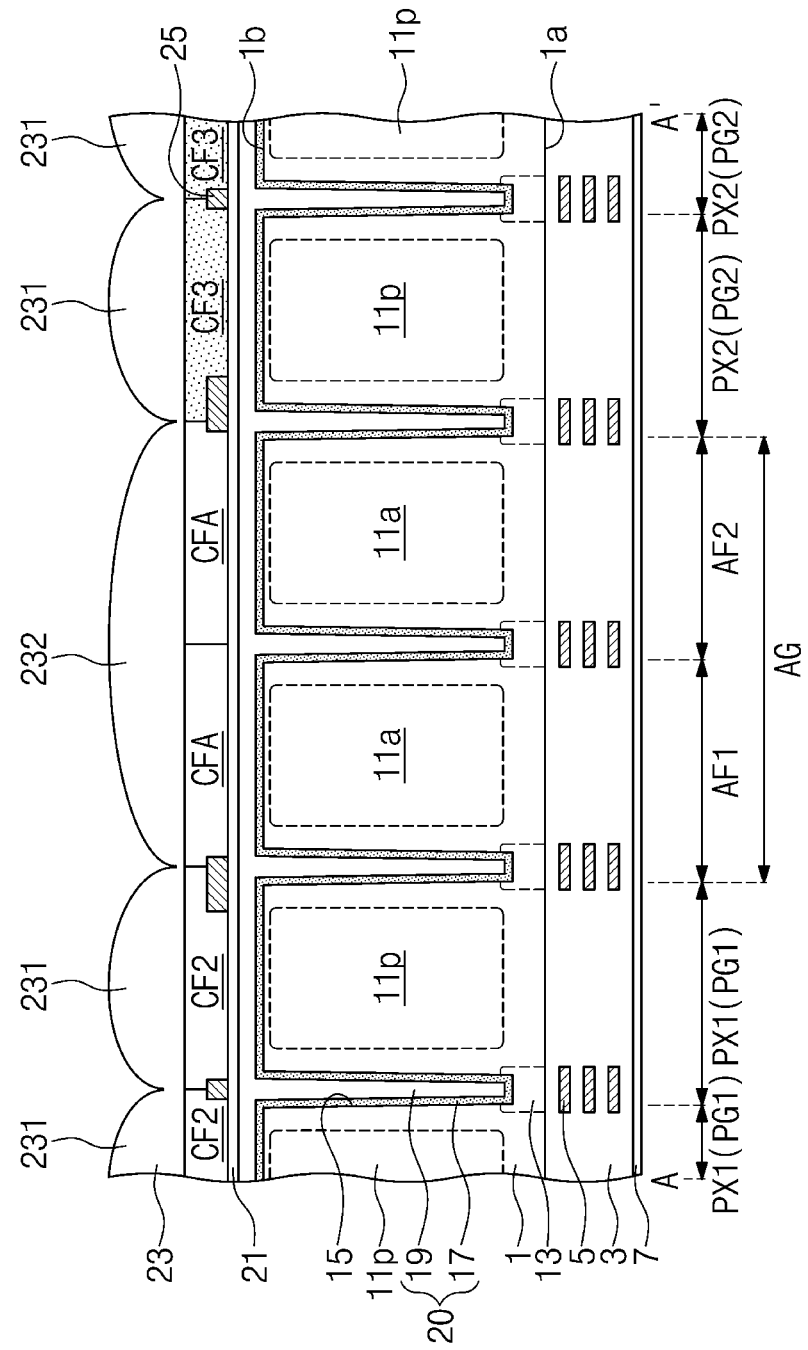
FIG. 12A is a sectional view taken along a line A-A' of FIG. 11.
Figure 12B:
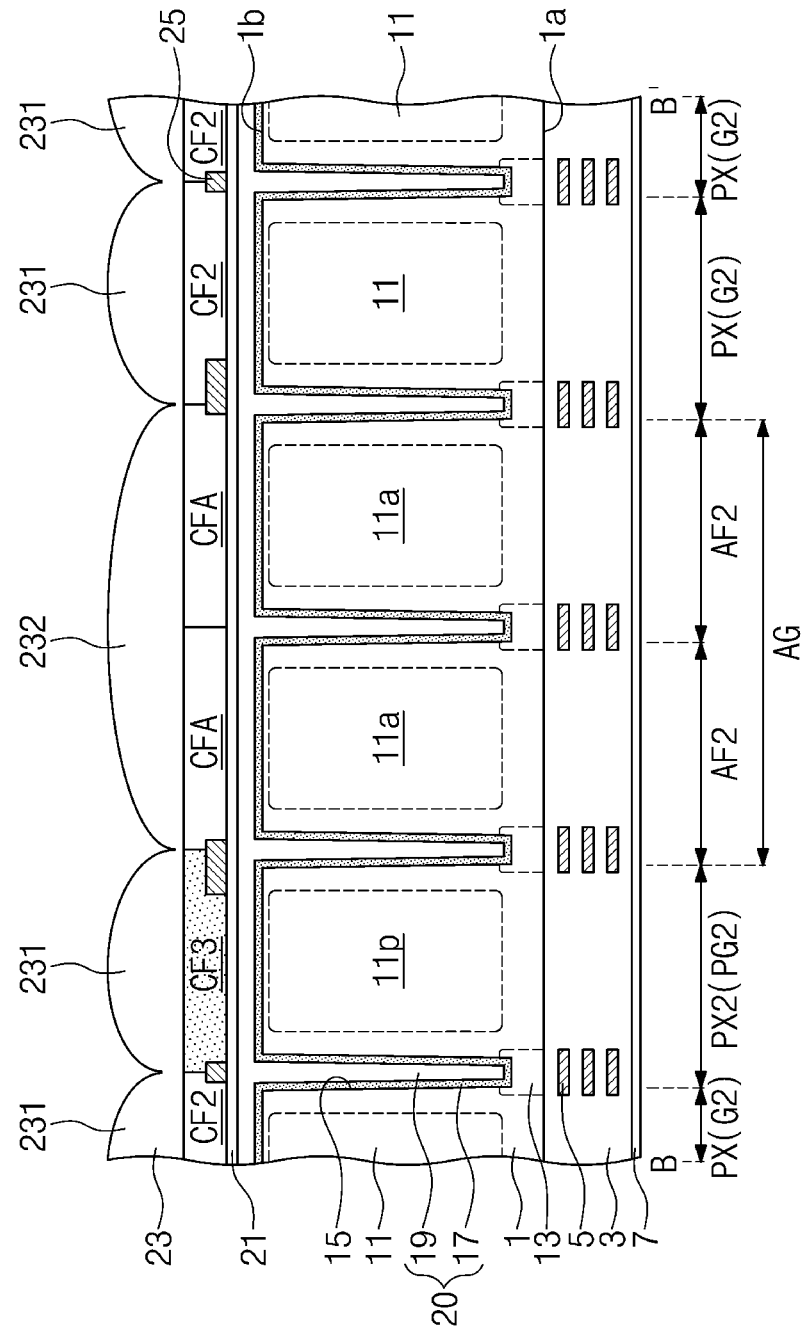
FIG. 12B is a sectional view taken along a line B-B' of FIG. 11.

FIG. 11 is a plan view illustrating an image sensor 55 according to an exemplary embodiment. FIG. 12A is a sectional view taken along a line A-A' of FIG. 11. FIG. 12B is a sectional view taken along a line B-B' of FIG. 11.

Referring to FIGS. 11, 12A, and 12B, in an image sensor 55 according to the present exemplary embodiment, each of the image pixel groups G1, G2, and G3 may include nona-type nine image pixels PX, which are arranged in the form of a 3×3 matrix (3 columns and 3 rows). The AF pixel group AG may include four AF pixels, which are arranged in the form of a 2×2 matrix. The AF pixel group AG may include two first AF pixels AF1 and two second AF pixels AF2.

The first peripheral image pixel group PG1 may have a structure in which two pixels are omitted from the 3×3 pixels of the second image pixel group G2. The second peripheral image pixel group PG2 may have a structure in which two pixels are omitted from the 3×3 pixels of the third image pixel group G3. A portion of the first peripheral image pixel group PG1 may be in contact with a portion of the second peripheral image pixel group PG2.

That is, in an adjacent pair of the second image pixel group G2 and the third image pixel group G3, two pixels selected from the second image pixel group G2 and two pixels selected from the third image pixel group G3 may be used as the first AF pixels AF1 and the second AF pixels AF2 constituting the AF pixel group AG, respectively. Each of the adjacent pair of the second image pixel group G2 and the third image pixel group G3 lacks two pixels as compared to other second image pixel groups G2 and third image pixel groups G3, so that the adjacent pair of the second image pixel group G2 and the third image pixel group G3 may be used as the first peripheral image pixel group PG1 and the second peripheral image pixel group PG2, respectively.

One second micro lens portion 232 may cover two first AF pixels AF1 and two second AF pixels AF2. The second micro lens portion 232 may have a circular shape when viewed in a plan view. Features associated with the thickness of the micro lens array layer 23 may be the same as or similar to those described with reference to FIG. 2A. The light-blocking pattern 25 may not be provided on the substrate 1 between the first AF pixels AF1, between the second AF pixels AF2, and between the first AF pixels AF1 and the second AF pixels AF2. Features associated with the width of the light-blocking pattern 25 may be the same as or similar to those described with reference to FIGS. 5, 6A, and 6B. The planar areas of the photoelectric conversion portions 11, 11*p*, and 11*a* may differ from each other in the same or similar manner as those described with reference to FIGS. 9, 10A, and 10B. Except for these differences, the image sensor 55 according to the present exemplary embodiment may be the same as or similar to those in the above-described exemplary embodiments.

Figure 13:
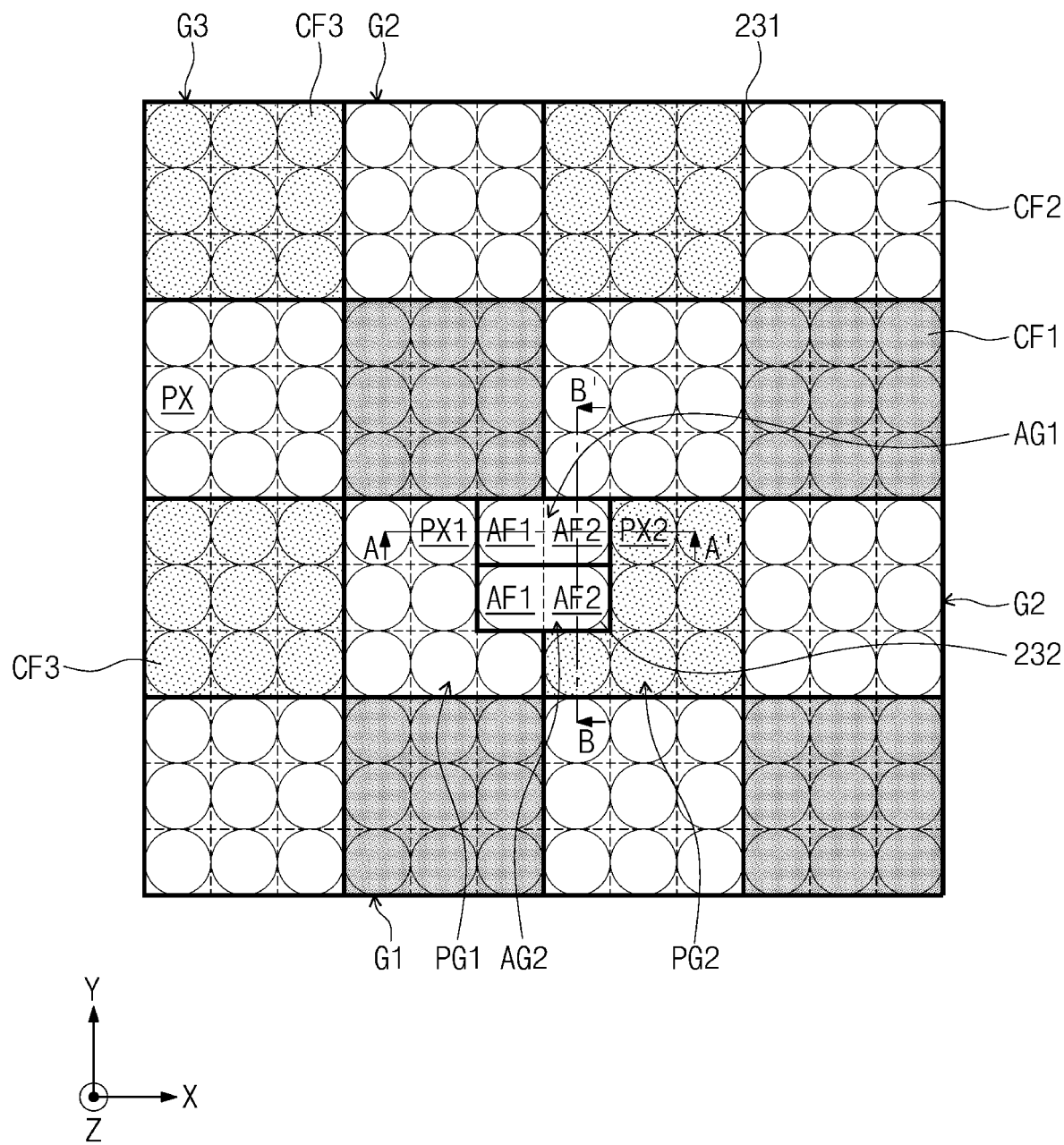
FIG. 13 is a plan view illustrating an image sensor according to an exemplary embodiment.
Figure 14:
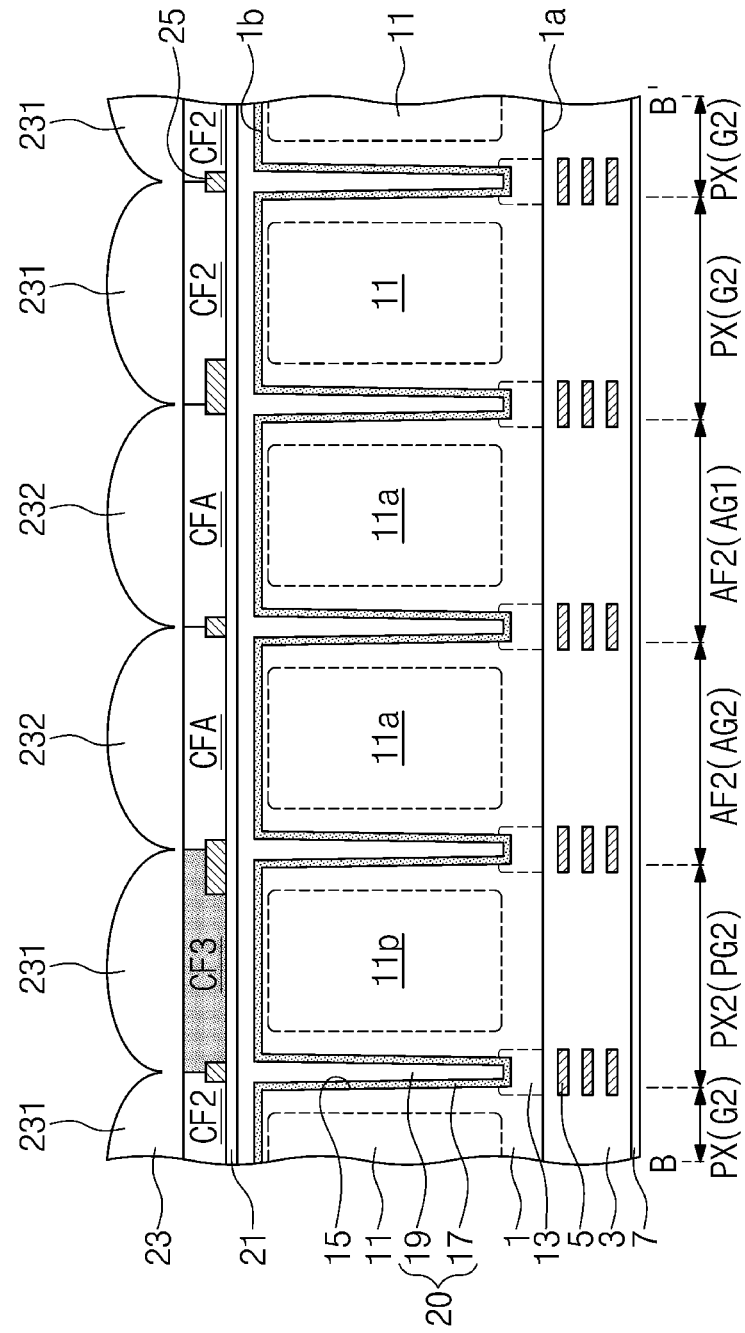
FIG. 14 is a sectional view taken along a line B-B' of FIG. 13.

FIG. 13 is a plan view illustrating an image sensor 56 according to an exemplary embodiment. FIG. 14 is a sectional view taken along a line B-B' of FIG. 13. A section taken along a line A-A' of FIG. 14 may be the same as or similar to that shown in FIG. 12A.

Referring to FIGS. 13 and 14, an image sensor 56 according to the present exemplary embodiment may include a first AF pixel group AG1 and a second AF pixel group AG2, which are disposed between the first peripheral image pixel group PG1 and the second peripheral image pixel group PG2. The first AF pixel group AG1 and the second AF pixel group AG2 may be arranged in the second direction Y. The first AF pixel group AG1 may include the first AF pixel AF1 and the second AF pixel AF2 arranged in the first direction X. The second AF pixel group AG2 may include the first AF pixel AF1 and the second AF pixel AF2 arranged in the first direction X. The light-blocking pattern 25 may be located between the first AF pixel group AG1 and the second AF pixel group AG2 and on the substrate 1. Features associated with the thickness of the micro lens array layer 23 may be the same as or similar to those described with reference to FIG. 2A. Features associated with the width of the light-blocking pattern 25 may be the same as or similar to those described with reference to FIGS. 5, 6A, and 6B. The planar areas of the photoelectric conversion portions 11, 11p, and 11a may differ from each other in the same or similar manner as those described with reference to FIGS. 9, 10A, and 10B. Except for these differences, the image sensor 56 according to the present exemplary embodiment may be the same as or similar to those in the above-described exemplary embodiments.

Figure 15:
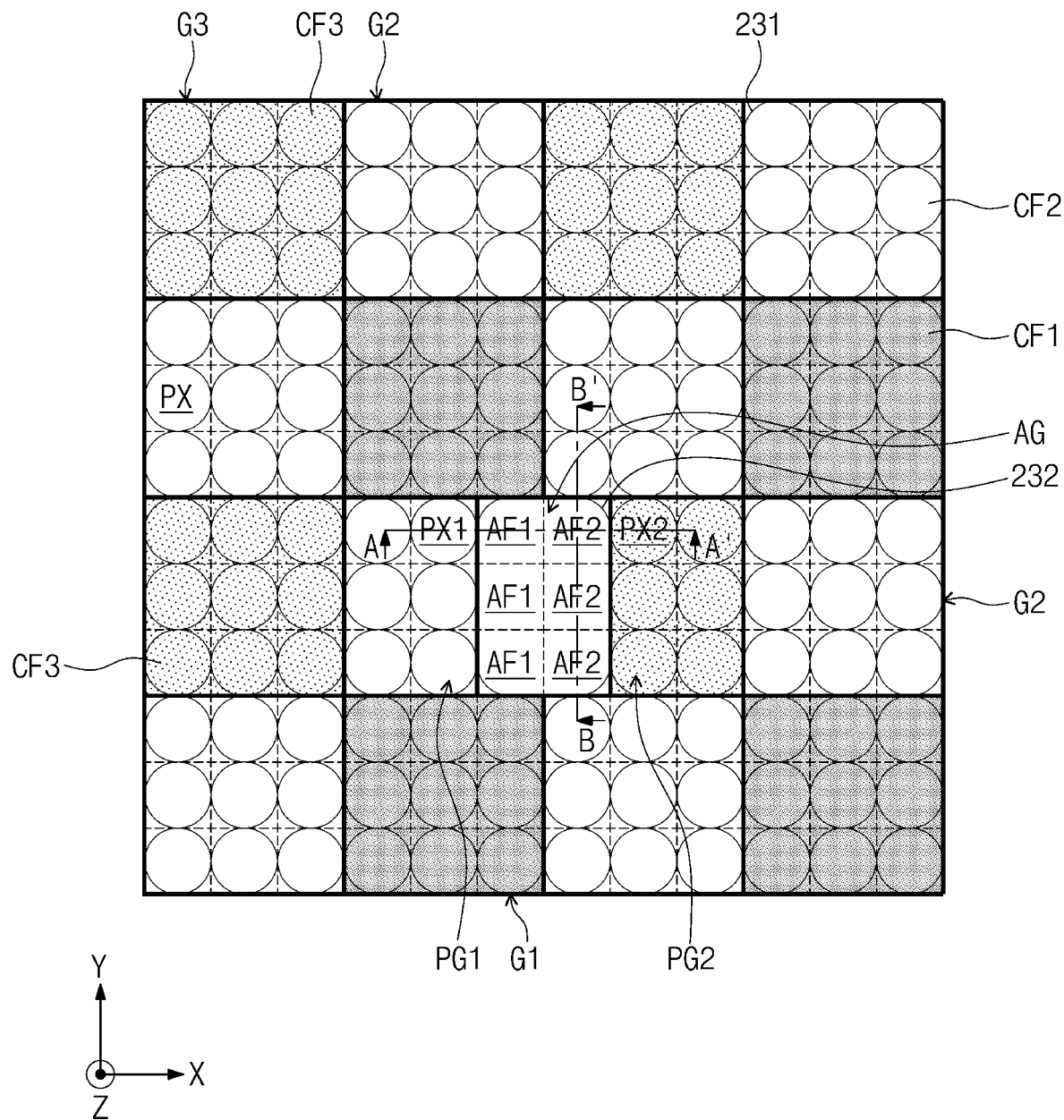
FIG. 15 is a plan view illustrating an image sensor according to an exemplary embodiment.
Figure 16:
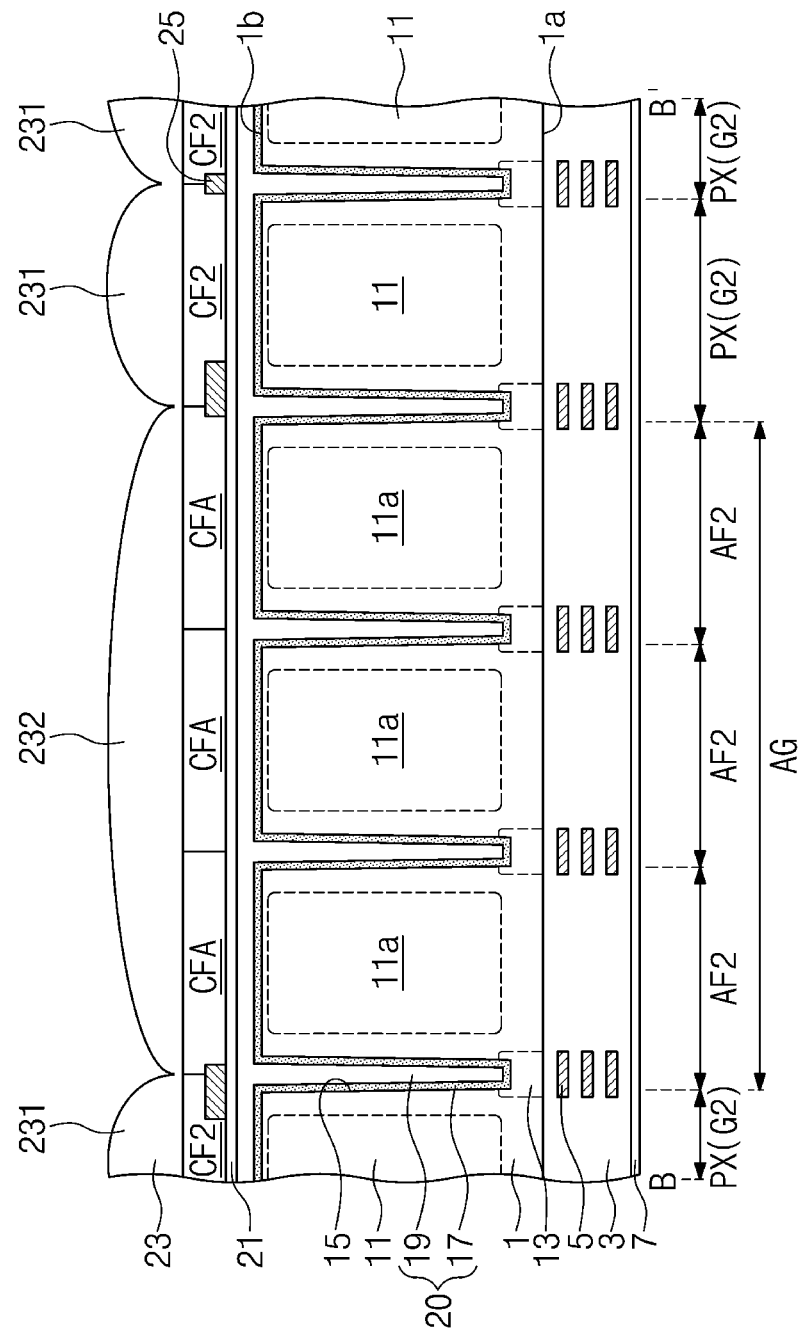
FIG. 16 is a sectional view taken along a line B-B' of FIG. 15.

FIG. 15 is a plan view illustrating an image sensor 57 according to an exemplary embodiment. FIG. 16 is a sectional view taken along a line B-B' of FIG. 15. A section taken along a line A-A' of FIG. 16 may be the same as or similar to that shown in FIG. 12A.

Referring to FIGS. 15 and 16, in an image sensor 57 according to the present exemplary embodiment, each of the image pixel groups G1, G2, and G3 may include nona-type nine image pixels PX, which are arranged in the form of a 3×3 matrix. The AF pixel group AG may include six AF pixels, which are arranged in the form of a 2×3 matrix. The AF pixel group AG may include three first AF pixels AF1 and three second AF pixels AF2.

The first peripheral image pixel group PG1 may have a structure in which three pixels are omitted from the 3×3 pixels of the second image pixel group G2. The second peripheral image pixel group PG2 may have a structure in which three pixels are omitted from the 3×3 pixels of the third image pixel group G3. The first peripheral image pixel group PG1 may be spaced apart from (or not adjacent to or contacting) the second peripheral image pixel group PG2.

That is, in an adjacent pair of the second image pixel group G2 and the third image pixel group G3, three pixels selected from the second image pixel group G2 and three pixels selected from the third image pixel group G3 may be used as the first AF pixels AF1 and the second AF pixels AF2 constituting the AF pixel group AG, respectively. Each of the adjacent pair of the second image pixel group G2 and the third image pixel group G3 lacks three pixels as compared to other second image pixel groups G2 and other third image pixel groups G3, so that the adjacent pair of the second image pixel group G2 and the third image pixel group G3 may be used as the first peripheral image pixel group PG1 and the second peripheral image pixel group PG2, respectively.

One second micro lens portion 232 may cover three first AF pixels AF1 and three second AF pixels AF2. Features associated with the thickness of the micro lens array layer 23 may be the same as or similar to those described with reference to FIG. 2A. The light-blocking pattern 25 may not be provided on the substrate 1 between the first AF pixels AF1, between the second AF pixels AF2, and between the first AF pixels AF1 and the second AF pixels AF2. Features associated with the width of the light-blocking pattern 25 may be the same as or similar to those described with reference to FIGS. 5, 6A, and 6B. The planar areas of the photoelectric conversion portions 11, 11p, and 11a may differ from each other in the same or similar manner as those described with reference to FIGS. 9, 10A, and 10B. Except for these differences, the image sensor 57 according to the present exemplary embodiment may be the same as or similar to those in the above-described exemplary embodiments.

Figure 17:
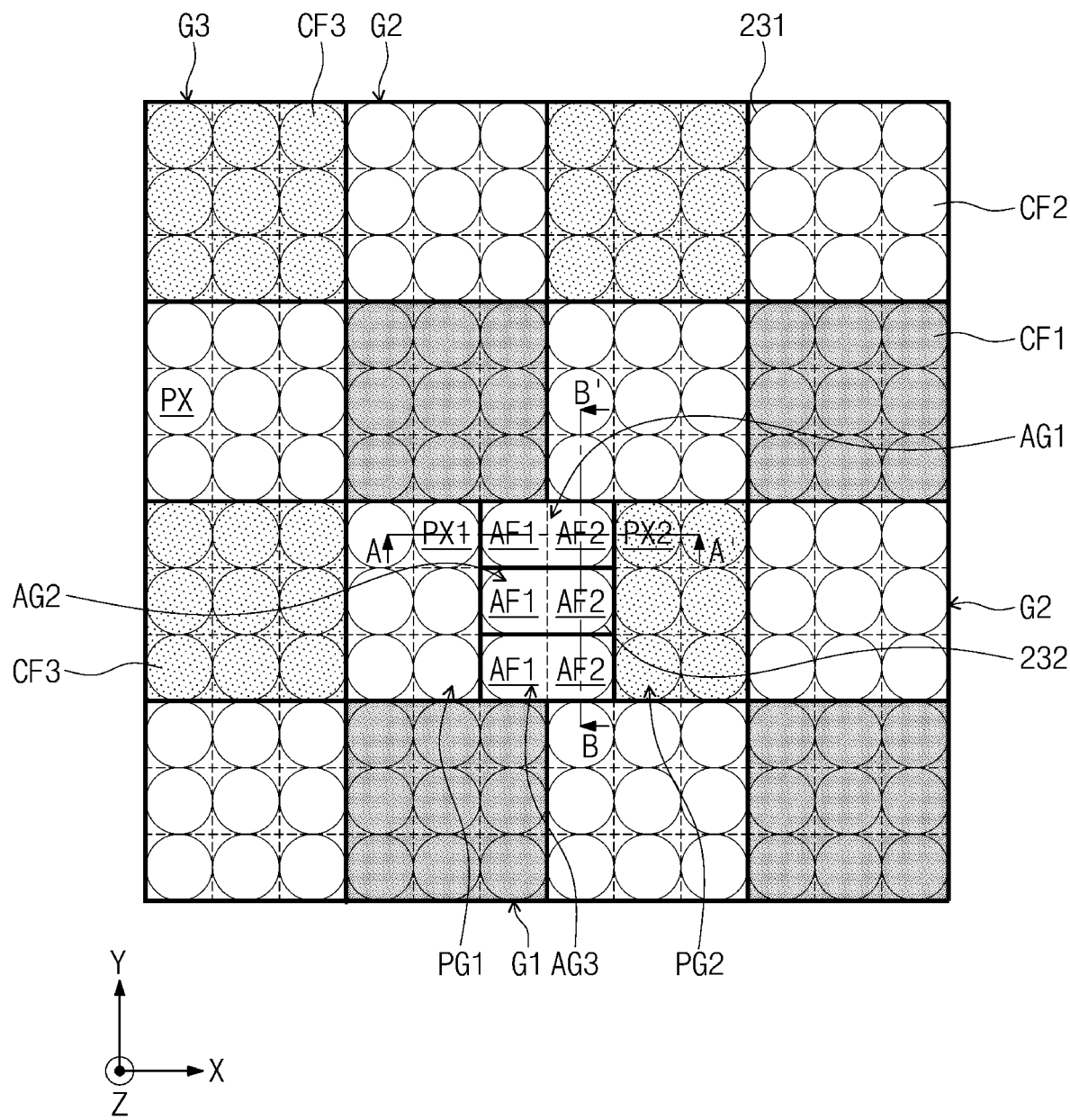
FIG. 17 is a plan view illustrating an image sensor according to an exemplary embodiment.
Figure 18:
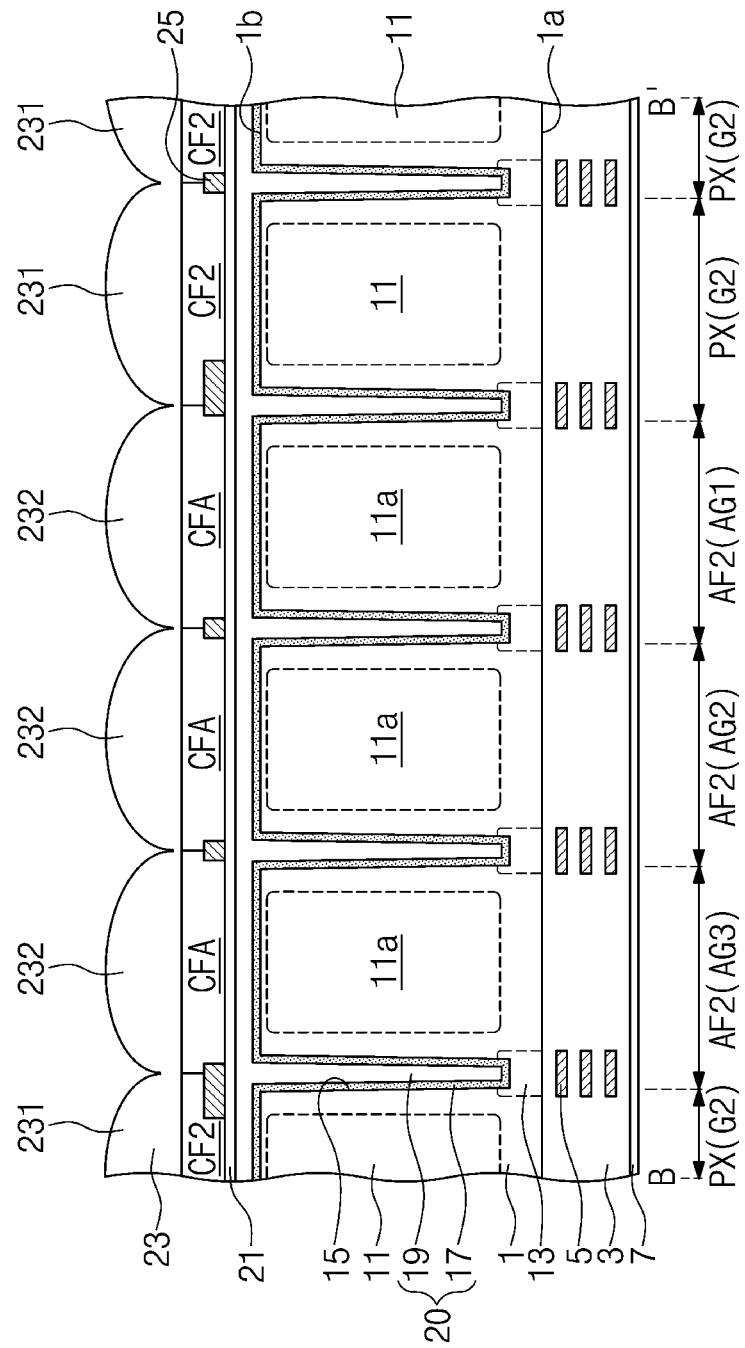
FIG. 18 is a sectional view taken along a line B-B' of FIG. 17.

FIG. 17 is a plan view illustrating an image sensor 58 according to an exemplary embodiment. FIG. 18 is a sectional view taken along a line B-B' of FIG. 17. A section taken along a line A-A' of FIG. 17 may be the same as or similar to that shown in FIG. 12A.

Referring to FIGS. 17 and 18, an image sensor 58 according to the present exemplary embodiment may include a first AF pixel group AG1, a second AF pixel group AG2, and a third AF pixel group AG3, which are disposed between the first peripheral image pixel group PG1 and the second peripheral image pixel group PG2. The first to third AF pixel groups AG1, AG2, and AG3 may be arranged in the second direction Y. Each of the first to third AF pixel groups AG1, AG2, and AG3 may include the first AF pixel AF1 and the second AF pixel AF2, which are arranged in the first direction X. The light-blocking pattern 25 may be located on the substrate 1 and between the first to third AF pixel groups AG1, AG2, and AG3. Features associated with the thickness of the micro lens array layer 23 may be the same as or similar to those described with reference to FIG. 2A. Features associated with the width of the light-blocking pattern 25 may be the same as or similar to those described with reference to FIGS. 5, 6A, and 6B. The planar areas of the photoelectric conversion portions 11, 11p, and 11a may differ from each other in the same or similar manner as those described with reference to FIGS. 9, 10A, and 10B. Except for these differences, the image sensor 58 according to the present exemplary embodiment may be the same as or similar to those in the above-described exemplary embodiments.

According to one or more exemplary embodiments, a size of the micro lens may be adjusted to control a size of the pixel opening. In an embodiment, each of the image sensors 50-58 may have a high resolution (e.g., 100M pixels).

Figure 19:
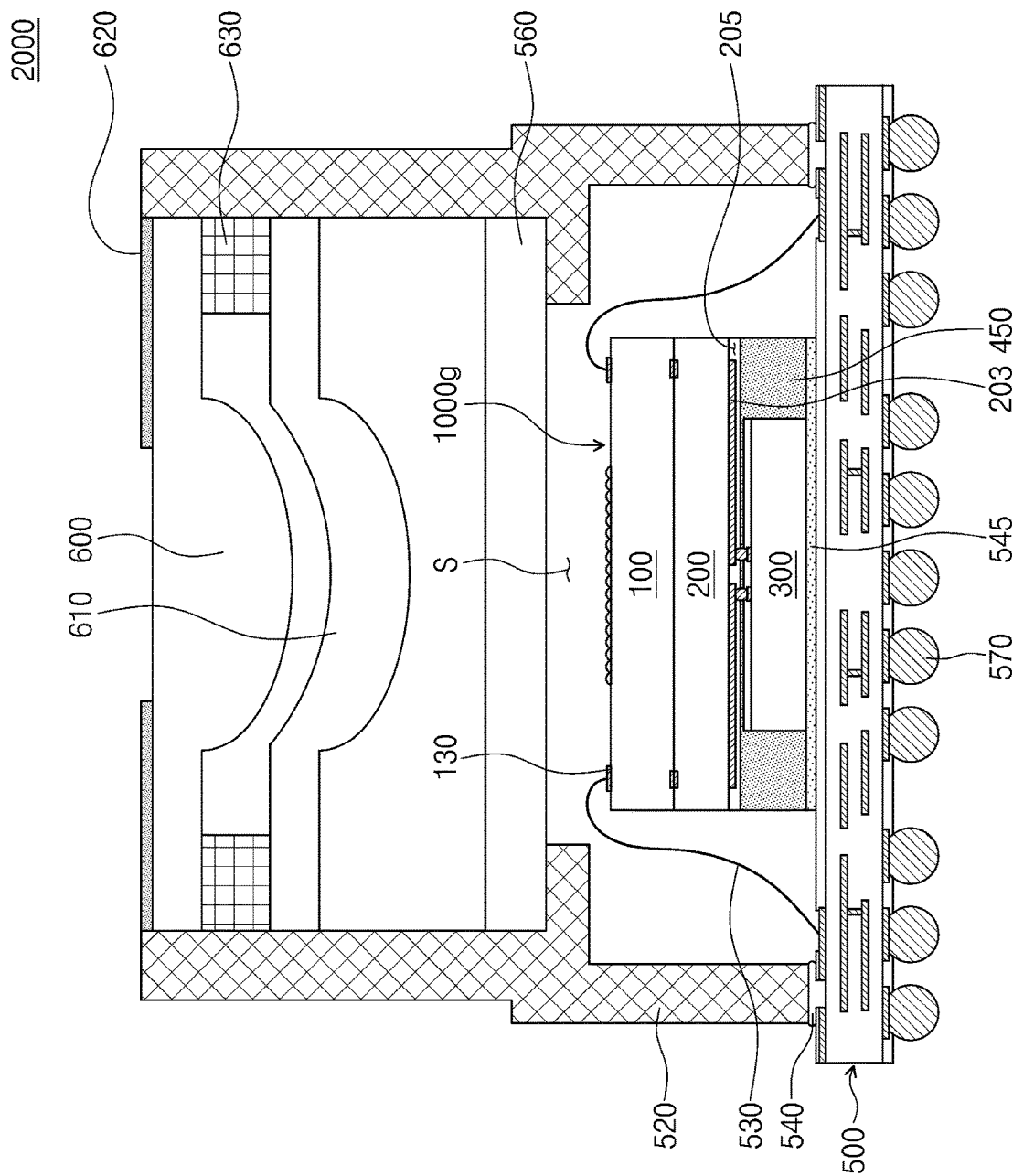
FIG. 19 is a sectional view illustrating a semiconductor package module according to an exemplary embodiment.

FIG. 19 is a sectional view illustrating a semiconductor package module 2000 according to an exemplary embodiment.

Referring to FIG. 19, in a semiconductor package module 2000 according to the present exemplary embodiment, a semiconductor package 1000g may be attached to a package substrate 500 by a first adhesive layer 545. The semiconductor package 1000g may include a first semiconductor chip 100, a second semiconductor chip 200 provided below the first semiconductor chip 100, and a third semiconductor chip 300 provided below the second semiconductor chip 200. The first to third semiconductor chips 100, 200, and 300 may have different functions. The first semiconductor chip 100 and the second semiconductor chip 200 may have substantially the same width. Sidewalls of the first semiconductor chip 100 and the second semiconductor chip 200 may be vertically aligned to each other. The first semiconductor chip 100 and the second semiconductor chip 200 may be in contact with each other. A redistribution pattern 203 may be disposed below the second semiconductor chip 200.

The first semiconductor chip 100 may be an image sensor chip, which includes one of the image sensors described with reference to FIGS. 1A to 18. The second semiconductor chip 200 may be a logic chip, which is used to operate the first semiconductor chip 100. A width of the third semiconductor chip 300 may be less than a width of the second semiconductor chip 200. That is, a sidewall of the third semiconductor chip 300 may not be vertically aligned to the sidewall of the second semiconductor chip 200. The third semiconductor chip 300 may be, for example, a memory chip, which is used to store data produced by the first semiconductor chip 100 or the second semiconductor chip 200. In an exemplary embodiment, the third semiconductor chip 300 may be a DRAM chip. A side surface of the third semiconductor chip 300 and a bottom surface of a second passivation layer 205 may be covered with a mold layer 450.

In the present exemplary embodiment, the logic chip may be bonded to the image sensor chip, and the memory chip may be bonded to the logic chip in a flip-chip bonding manner. In this case, it may be possible to realize a fast readout function, as compared to the case in which the memory chip is located far from the image sensor chip. In the case where the memory chip is a DRAM chip, the positions and standards of input/output terminals may be standardized for mass production and low cost. However, in this case, the logic chip and the DRAM chip may differ from each other in sizes and positions of input/output terminals. According to an exemplary embodiment, since the second semiconductor chip 200, which may be the logic chip, includes the redistribution pattern 203, it may be possible to increase a degree of freedom in constructing an interconnection structure between the second semiconductor chip 200 and the third semiconductor chip 300.

A first upper conductive pad 130 of the first semiconductor chip 100 may be connected to the package substrate 500 through a wire 530. A holder 520 may be disposed on the package substrate 500. The holder 520 may be spaced apart from the semiconductor package 1000g. The holder 520 may be attached to the package substrate 500 by a second adhesive layer 540. The holder 520 may have a closed loop shape, when viewed in a plan view. The holder 520 may be adjacent to an edge of the semiconductor package 1000g and may have a hollow structure. The holder 520 may be formed of a polymer material (e.g., polyamide). A transparent substrate 560 may be disposed on the holder 520. The transparent substrate 560 may be formed of a transparent material (e.g., glass or plastic materials). The transparent substrate 560 may be spaced apart from the semiconductor package 1000g, and thus, an empty space S may be provided therebetween. A solder bump 570 may be attached to a bottom surface of the package substrate 500. A plurality of lenses 600 and 610, a spacer 630, and a blocking layer 620 may be disposed on the transparent substrate 560. The semiconductor package module 2000 may have a field-of-view (FOV) property that is greater than 20° and is smaller than 100°.

Figure 20:
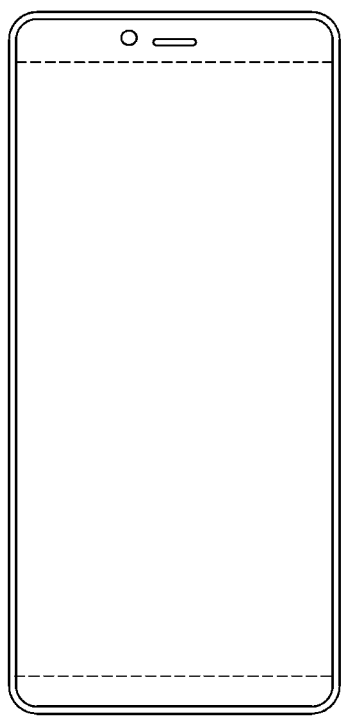
FIG. 20 is a plan view illustrating a mobile phone according to an exemplary embodiment.

FIG. 20 is a plan view illustrating a mobile phone 3000 according to an exemplary embodiment.

Referring to FIG. 20, a mobile phone 3000 according to an exemplary embodiment may include the semiconductor package module 2000 of FIG. 19. A camera of the mobile phone 3000 may be operated in a first mode, a second mode, and a third mode. The first mode may be a full resolution mode, and an image obtained in the first mode may have a high resolution and a high image quality. The second mode may be a resolution mode (e.g., mid resolution mode), whose resolution is lower than that of the first mode, and an image obtained in the second mode may have a resolution that is less than or equal to ½ of the resolution of the image obtained in the first mode. The third mode may be a resolution mode (e.g., low resolution mode), whose resolution is lower than those of the first and second modes, and an image obtained in the third mode may have a resolution that is less than or equal to ⅙ of the resolution of the image obtained in the first mode. These modes may be obtained by performing a binning operation on the image sensors described with reference to FIGS. 1A to 18. In the binning operation, electrical signals, which are generated by all image pixels of the image sensor, may be sensed, but a mean value for each group or for a plurality of groups having the same color may be output.

According to an exemplary embodiment, a light-blocking pattern may not be provided between AF pixels of an image sensor, thereby increasing phase detection efficiency, even when the number of the AF pixels is small.

In addition, an AF pixel group of the image sensor may be disposed to span a first image pixel group and a second image pixel group, which are adjacent to each other and have different colors, thereby increasing signal processing efficiency and improving binning and HDR characteristics.

Furthermore, in the image sensor, a width of a light-blocking pattern may be adjusted to obtain a desired pixel opening, or an area of a photoelectric conversion portion may be adjusted to compensate heterogeneous and sensitivity properties of an image pixel adjacent to the AF pixel. Accordingly, it may be possible to obtain an overall uniform and clear image. In addition, it may be possible to improve sensitivity of the image sensor, even under a low illumination condition.

It is understood that any feature of each of the above-described exemplary embodiments may be combined with any feature of any other of the above-described exemplary embodiments.

While example embodiments have been particularly shown and described, it will be understood by one of ordinary skill in the art that variations in form and detail may be made therein without departing from the spirit and scope of the attached claims.

What is claimed is:

1. An image sensor, comprising:
   pixel groups two-dimensionally arranged on a substrate, each of the pixel groups including a plurality of pixels; and
   a light-blocking pattern on the substrate and between pixels among the plurality of pixels,
   wherein the pixel groups comprise:
     first image pixel groups configured to sense a first light;
     second image pixel groups configured to sense a second light; and
     an auto-focus (AF) pixel group configured to detect a phase,
   wherein the AF pixel group comprises a first AF pixel and a second AF pixel adjacent to each other, and
   wherein the light-blocking pattern is absent on the substrate between the first AF pixel and the second AF pixel,
   wherein the image sensor further comprises:
     a first peripheral image pixel group, between the first AF pixel and a closest first image pixel group, among the first image pixel groups, closest to the first AF pixel, the first peripheral image pixel group including less pixels than the closest first image pixel group; and a second peripheral image pixel group, between the second AF pixel and a closest second image pixel group, among the second image pixel groups, closest to the second AF pixel, the second peripheral image pixel group including less pixels than the closest second image pixel group, wherein the first peripheral image pixel group is configured to sense the second light, wherein the second peripheral image pixel group is configured to sense the first light, and wherein:

each of the first image pixel groups and the second image pixel groups comprises n×m first image pixels;

each of the first peripheral image pixel group and the second peripheral image pixel group comprises first peripheral image pixels, a number of which is greater than or equal to (n×m)/2 and less than or equal to (n×m)−1; and n and m are each independently a natural number that is greater than or equal to 3.

2. The image sensor of claim 1, further comprising:
a micro lens array layer on the substrate to cover the light-blocking pattern,
wherein the micro lens array layer has a first thickness between the first peripheral image pixel group and the AF pixel group and a second thickness between the first peripheral image pixel group and the closest first image pixel group, and
wherein the first thickness is less than the second thickness.

3. The image sensor of claim 1, further comprising:
a micro lens array layer on the substrate to cover the light-blocking pattern,
wherein a first distance from a top end of the micro lens array layer to the substrate, measured between the first peripheral image pixel group and the AF pixel group, is less than a second distance from a top end of the micro lens array layer to the substrate, measured between the first peripheral image pixel group and the closest first image pixel group.

4. The image sensor of claim 1, further comprising:
a micro lens array layer on the substrate to cover the light-blocking pattern,
wherein the micro lens array layer comprises:
first micro lens portions on the first image pixel groups, the second image pixel groups, the first peripheral image pixel group, and the second peripheral image pixel group, respectively; and
a second micro lens portion on the AF pixel group, and
wherein the second micro lens portion covers both of the first AF pixel and the second AF pixel.

5. The image sensor of claim 1, wherein:
the light-blocking pattern has a first width in a region between the closest first image pixel group and the first peripheral image pixel group;
the light-blocking pattern has a second width in a region between the first peripheral image pixel group and the AF pixel group; and
the second width is greater than the first width.

6. The image sensor of claim 5, wherein:
the light-blocking pattern has a third width in a region between the second peripheral image pixel group and the AF pixel group;
the third width is greater than the first width; and
the third width is different from the second width.

7. The image sensor of claim 1, wherein:
the first peripheral image pixel group comprises first peripheral image pixels;
a first peripheral image pixel, from among the first peripheral image pixels, comprises a first peripheral photoelectric conversion portion in the substrate;
the first AF pixel comprises a first AF photoelectric conversion portion in the substrate; and
an area of the first peripheral photoelectric conversion portion is less than an area of the first AF photoelectric conversion portion, when viewed in a plan view.

8. The image sensor of claim 1, wherein:
the first peripheral image pixel group comprises first peripheral image pixels;
each of the first image pixel groups comprises first image pixels;
a first peripheral image pixel, from among the first peripheral image pixels, comprises a first peripheral photoelectric conversion portion in the substrate;
a first image pixel, from among the first image pixels, comprises a first photoelectric conversion portion in the substrate; and
an area of the first peripheral photoelectric conversion portion is less than an area of the first photoelectric conversion portion, when viewed in a plan view.

9. The image sensor of claim 1, further comprising:
first color filters on the substrate and in the second image pixel group and the first peripheral image pixel group;
second color filters on the substrate and in the first image pixel group and the second peripheral image pixel group; and
at least one third color filter on the substrate and in the AF pixel group,
wherein the at least one third color filter has a same color as the first color filters or is colorless transparent.

10. The image sensor of claim 9, wherein:
the first color filters comprise a green dye; and
the second color filters comprise a red dye or a blue dye.

11. The image sensor of claim 1, wherein:
a plurality of AF pixel groups are provided, each comprising the first AF pixel and the second AF pixel; and
a total number of the first AF pixels and the second AF pixels of the plurality of AF pixel groups is 0.5%40% of a total number of the plurality of pixels.

12. An image sensor, comprising:
pixel groups two-dimensionally arranged on a substrate, each of the pixel groups including a plurality of pixels; and
a micro lens array layer covering the substrate,
wherein the pixels are separated from each other by a deep device isolation structure in the substrate,
wherein each of the pixels comprises a photoelectric conversion portion provided in the substrate,
wherein the pixel groups comprise:
image pixel groups;
an auto-focus (AF) pixel group configured to detect a phase; and
a first peripheral pixel group located between the AF pixel group and a closest image pixel group, among the image pixel groups, closest to the AF pixel group, and
wherein a first distance from a top end of the micro lens array layer to the substrate, measured between the peripheral image pixel group and the AF pixel group, is less than a second distance from a top end of the micro lens array layer to the substrate, measured between the peripheral image pixel group and the closest image pixel group.

13. The image sensor of claim 12, wherein:

the micro lens array layer has a first thickness between the first peripheral image pixel group and the AF pixel group and a second thickness between the first peripheral image pixel group and the closest image pixel group; and the first thickness is less than the second thickness.

14. The image sensor of claim 12, wherein:

the first peripheral image pixel group comprises first peripheral image pixels;

a first peripheral image pixel, from among the first peripheral image pixels, comprises a first peripheral photoelectric conversion portion in the substrate;

a first AF pixel, comprised in the AF pixel group and adjacent to the first peripheral image pixel group, comprises a first AF photoelectric conversion portion in the substrate; and an area of the first peripheral photoelectric conversion portion is less than an area of the first AF photoelectric conversion portion, when viewed in a plan view.

15. An image sensor, comprising:

pixel groups that are two-dimensionally arranged on a substrate, each of the pixel groups including a plurality of pixels, wherein the pixel groups comprise:
 image pixel groups;
 an auto-focus (AF) pixel group configured to detect a phase; and
 a peripheral image pixel group located between the AF pixel group and a closest image pixel group, among the image pixel groups, closest to the AF pixel group, wherein the peripheral image pixel group comprises a plurality of peripheral image pixels, wherein the AF pixel group comprises a plurality of AF pixels, wherein a peripheral image pixel, among the peripheral image pixels, comprises a peripheral photoelectric conversion portion in the substrate, wherein an AF pixel, among the AF pixels, comprises an AF photoelectric conversion portion in the substrate, and wherein an area of the peripheral photoelectric conversion portion is less than an area of the AF photoelectric conversion portion, when viewed in a plan view.

16. The image sensor of claim 15, wherein:

each of the image pixel groups comprises a plurality of photoelectric conversion portions in the substrate; and the area of the peripheral photoelectric conversion portion is less than an area of each of the plurality of photoelectric conversion portions, when viewed in a plan view.

17. The image sensor of claim 15, further comprising:

a micro lens array layer on the substrate, wherein a first distance from a top end of the micro lens array layer to the substrate, measured between the peripheral image pixel group and the AF pixel group, is less than a second distance from a top end of the micro lens array layer to the substrate, measured between the peripheral image pixel group and the closest image pixel group.

18. The image sensor of claim 15, further comprising:

a light-blocking pattern on the substrate and between the pixel groups, wherein the AF pixel group comprises a first AF pixel and a second AF pixel adjacent to each other, and wherein the light-blocking pattern is absent on the substrate between the first AF pixel and the second AF pixel.

* * * * *

UNITED STATES PATENT AND TRADEMARK OFFICE
CERTIFICATE OF CORRECTION

PATENT NO. : 11,297,219 B2
APPLICATION NO. : 16/847146
DATED : April 5, 2022
INVENTOR(S) : Kim et al.

Page 1 of 1

It is certified that error appears in the above-identified patent and that said Letters Patent is hereby corrected as shown below:

In the Claims

Column 18, Line 57 (Claim 12):
Delete "a first peripheral pixel group located between the AF"
Insert --a first peripheral image pixel group located between the AF--

Column 18, Line 63 (Claim 12):
Delete "peripheral image pixel group and the AF pixel group, is"
Insert --first peripheral image pixel group and the AF pixel group, is--

Column 18, Line 63 (Claim 12):
Delete "peripheral image pixel group and the closest image"
Insert --first peripheral image pixel group and the closest image--

Signed and Sealed this
Sixteenth Day of August, 2022

Katherine Kelly Vidal
*Director of the United States Patent and Trademark Office*